US006822536B1

(12) United States Patent
Nishimura et al.

(10) Patent No.: US 6,822,536 B1
(45) Date of Patent: Nov. 23, 2004

(54) LONGITUDINALLY COUPLED MULTI-MODE PIEZOELECTRIC BULK WAVE FILTER DEVICE, LONGITUDINALLY COUPLED MULTI-MODE PIEZOELECTRIC BULK WAVE FILTER, AND ELECTRONIC COMPONENT

(75) Inventors: Toshio Nishimura, Shiga-ken (JP); Jiro Inoue, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 55 days.

(21) Appl. No.: 10/438,908

(22) Filed: May 16, 2003

(30) Foreign Application Priority Data

May 24, 2002 (JP) ........................................ 2002-150816
May 24, 2002 (JP) ........................................ 2002-150818

(51) Int. Cl.[7] ............................ H03H 9/54; H01L 41/04
(52) U.S. Cl. ...................... 333/189; 333/187; 310/366; 310/328
(58) Field of Search ............................. 333/186–192; 310/328, 366

(56) References Cited

U.S. PATENT DOCUMENTS

| 4,223,286 | A | * | 9/1980 | Ono et al. ................... 333/195 |
|---|---|---|---|---|
| 4,383,194 | A | * | 5/1983 | Ohigashi et al. ............ 310/326 |
| 4,771,205 | A | * | 9/1988 | Mequio ....................... 310/334 |
| 5,422,533 | A | * | 6/1995 | Kosinski et al. ............. 310/335 |
| 5,548,179 | A | * | 8/1996 | Kaida ........................... 310/367 |
| 5,608,362 | A | * | 3/1997 | Nishimura et al. .......... 333/191 |
| 5,757,106 | A | * | 5/1998 | Sato et al. .................... 310/359 |
| 5,821,833 | A | * | 10/1998 | Lakin ........................... 333/187 |
| 5,872,493 | A | * | 2/1999 | Ella .............................. 333/191 |
| 6,091,180 | A | * | 7/2000 | Unami et al. ................ 310/328 |
| 6,201,337 | B1 | * | 3/2001 | Kaida et al. ................. 310/321 |
| 6,466,106 | B1 | * | 10/2002 | Gamo .......................... 333/189 |
| 6,608,428 | B2 | * | 8/2003 | Nishimura et al. .......... 310/366 |
| 6,717,335 | B2 | * | 4/2004 | Nishimura et al. .......... 310/364 |
| 6,784,763 | B2 | * | 8/2004 | Nishimura et al. .......... 333/189 |

FOREIGN PATENT DOCUMENTS

| JP | 5-327401 | | 12/1993 |
|---|---|---|---|
| JP | 10-215140 | * | 8/1998 |

* cited by examiner

*Primary Examiner*—Barbara Summons
(74) *Attorney, Agent, or Firm*—Keating & Bennett, LLP

(57) ABSTRACT

A longitudinally coupled multi-mode piezoelectric bulk wave filter device which is manufactured at low cost, presents a wide bandwidth, results in a large attenuation, and includes first and second piezoelectric bulk wave filters which are mounted on a casing substrate. The first and second piezoelectric bulk wave filters are arranged such that the distance between the ground electrodes of the first and second piezoelectric bulk wave filters is smaller than the distance between input electrodes of the first and second piezoelectric bulk wave filters and the distance between output electrodes of the first and second piezoelectric bulk wave filters. When an input signal is applied between the input electrode and the ground electrode, harmonic waves of different orders are excited and coupled. A filter output is provided between the output electrode and the ground electrode.

20 Claims, 42 Drawing Sheets

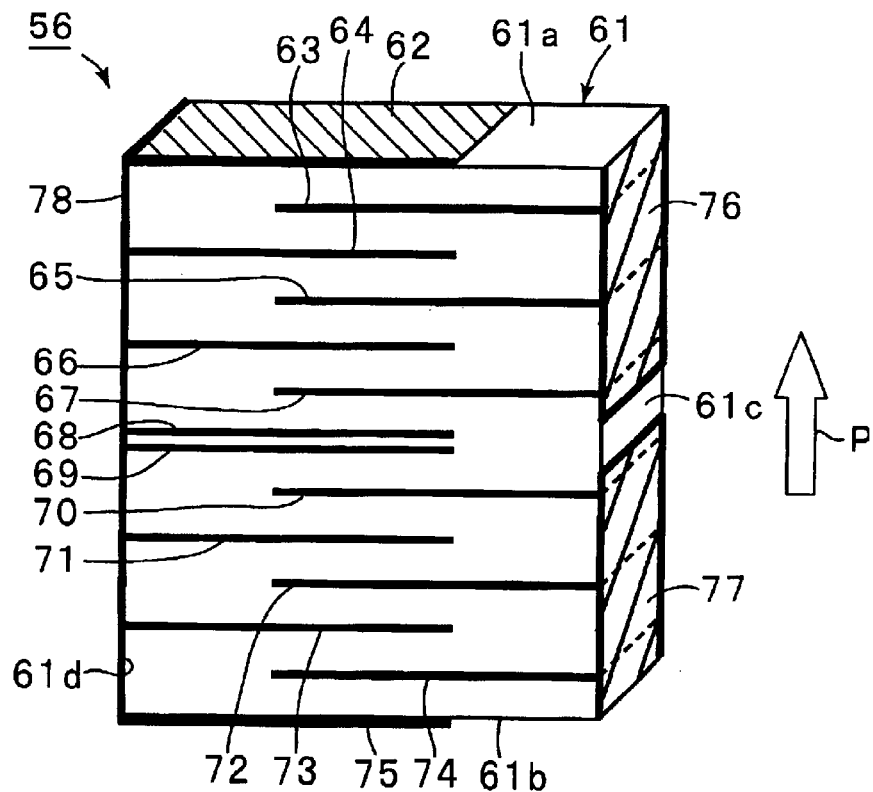
FIG. 11A
FIG. 11B    FIG. 11C    FIG. 11D

LONGITUDINALLY COUPLED MULTI-MODE PIEZOELECTRIC BULK WAVE FILTER DEVICE, LONGITUDINALLY COUPLED MULTI-MODE PIEZOELECTRIC BULK WAVE FILTER, AND ELECTRONIC COMPONENT

BACKGROUND OF THE INVENTION

1. Field of the Invention

The present invention relates to a piezoelectric bulk wave filter which can be used as a bandpass filter, for example. More specifically, the present invention relates to a longitudinally coupled multi-mode piezoelectric bulk wave filter device, a longitudinally coupled multi-mode piezoelectric bulk wave filter, and an electronic component including such a piezoelectric bulk wave filter using a harmonic wave of vibration. The present invention also relates to a longitudinally coupled multi-mode piezoelectric bulk wave filter device and an electronic component including a piezoelectric bulk wave filter which couples harmonic waves of different orders.

2. Description of the Related Art

A variety of piezoelectric bulk wave filters are used as bandpass filters. Dual-mode piezoelectric bulk wave filters are mainly used within a frequency range of several MHz to tens of MHz because of the ease in which they can be miniaturized and their low cost.

A dual-mode piezoelectric bulk wave filter is disclosed in Japanese Unexamined Patent Application Publication No. 5-327401.

FIG. 18 is a cross-sectional view of a conventional dual-mode piezoelectric bulk wave filter using a thickness longitudinal vibration.

A piezoelectric bulk wave filter 201 includes a piezoelectric substrate 202 that is polarized in the thickness direction. A pair of exciting electrodes 203 and 204 are disposed on the top surface of the piezoelectric substrate 202. A common exciting electrode 205 is opposed to the exciting electrodes 203 and 204 with the piezoelectric substrate 202 sandwiched therebetween.

During use, an input signal is applied between one exciting electrode 203 and the common exciting electrode 205 to excite the piezoelectric substrate 202. When the piezoelectric substrate 202 is excited, a symmetrical mode shown in FIG. 19A and an anti-symmetrical mode shown in FIG. 19B are generated. The two modes are coupled, forming a filter bandwidth. An output is picked up between the exciting electrode 204 and the ground electrode 205.

Also known, in addition to the dual-mode piezoelectric bulk wave filter operating in the thickness longitudinal mode, is the dual-mode piezoelectric bulk wave filter which includes the piezoelectric substrate 202 polarized in a direction parallel to the top surface and operating in a shear vibration mode.

The degree of coupling between the symmetrical mode and anti-symmetrical mode in the conventional piezoelectric bulk wave filter 201 depends on the spacing between the exciting electrodes 203 and 204. The spacing determines a frequency difference between the symmetrical mode and the anti-symmetrical mode, thereby determining a passband.

Specifically, to produce a wide band filter, the spacing between the exciting electrodes 203 and 204 must be narrowed to increase the degree of coupling between the two modes and to increase the frequency between the two modes.

The exciting electrodes 203 and 204 are typically produced using a screen printing of electrically conductive paste. The screen printing technique has limited ability to narrow the spacing between the exciting electrodes 203 and 204. If the exciting electrodes 203 and 204 are produced using a photolithographic technique, the spacing between the exciting electrodes 203 and 204 is narrowed, but the costs involved increase.

Even if the spacing between the exciting electrodes 203 and 204 is narrowed, the capacitance between the exciting electrodes 203 and 204 increases in the piezoelectric bulk wave filter 201, which leads to a smaller attenuation.

To attain a large attenuation, a plurality of filter elements are typically connected in the piezoelectric bulk wave filter device. As shown in FIG. 20, first and second piezoelectric bulk wave filter elements 213 and 214 are mounted on a substrate 212 in a piezoelectric bulk wave filter device 211. The piezoelectric bulk wave filter element 213 and piezoelectric bulk wave filter element 214 are identical to each other in construction.

If the first and second piezoelectric bulk wave filter elements 213 and 214 are located too closely, a stray capacitance occurring between input and output of the first and second piezoelectric bulk wave filter elements 213 and 214 (as represented by an arrow A shown in FIG. 20) lowers the attenuation. For this reason, the first and second piezoelectric bulk wave filter elements 213 and 214 are not located too closely to each other. The whole filter device inevitably becomes large in size.

As another method to achieve a large attenuation, a piezoelectric bulk wave filter which includes a relay capacitor as shown in FIG. 21 has been proposed. As shown, a piezoelectric bulk wave filter 221 includes first and second energy trapped piezoelectric resonators 222 and 223 disposed on a piezoelectric substrate. To form a relay capacitor between the piezoelectric resonators 222 and 223, capacitor electrodes 224 and 225 are opposed to each other with the piezoelectric substrate sandwiched therebetween. FIG. 22 is a circuit diagram of the piezoelectric bulk wave filter 221 shown in FIG. 21.

The relay capacitor C is formed of the capacitor electrodes 224 and 225 as shown in FIG. 22. Because the piezoelectric substrate forming the piezoelectric bulk wave filter 221 is polarized, an unwanted vibration occurs because of the piezoelectric effect on the portions of the piezoelectric substrate where the capacitor electrodes 224 and 225 are disposed. As a result, spurious vibrations occur.

A technique is known to partially polarize the piezoelectric substrate so that the piezoelectric substrate is not polarized in the portions where the capacitor electrodes 224 and 225 are opposed. However, if the piezoelectric substrate is partially polarized, there is a possibility that cracks may occur in the piezoelectric substrate.

SUMMARY OF THE INVENTION

In order to overcome the problems described above, preferred embodiments of the present invention provide a multi-mode piezoelectric bulk wave filter device, a multi-mode piezoelectric bulk wave filter, and an electronic component including the multi-mode piezoelectric bulk wave filter which has a wide bandwidth, has a large attenuation, is easy to miniaturize, and suppresses the generation of unwanted spurious vibrations. Preferred embodiments of the present invention also provide a longitudinally coupled multi-mode piezoelectric bulk wave filter that is manufactured at low costs.

In a first preferred embodiment of the present invention, a longitudinally coupled multi-mode piezoelectric bulk wave filter device includes first and second multi-mode piezoelectric bulk wave filters which are designed so that vibration modes of different orders of harmonic waves are excited and coupled to provide an output signal between an output electrode and an ground electrode when an input signal is input between an input electrode and the ground electrode. The longitudinally coupled multi-mode piezoelectric bulk wave filter device further includes a casing substrate on which the first and second longitudinally coupled multi-mode piezoelectric bulk wave filters are disposed on a surface thereof. Each of the first and second multi-mode piezoelectric bulk wave filters includes at least four exciting electrodes extending substantially parallel to each other and a laminated piezoelectric body, including a plurality of piezoelectric layers arranged between the exciting electrodes, and is polarized in a direction that is substantially perpendicular to or substantially parallel to the exciting electrodes.

The laminated piezoelectric body has first and second end surfaces facing in a direction that is substantially perpendicular to the plurality of the piezoelectric layers and first through fourth side surfaces connecting the first and second end surfaces. The input electrode is disposed on at least one of the first through fourth side surfaces of the laminated piezoelectric body and closer to the first end surface. The output electrode is disposed on at least one of the first through fourth side surfaces of the laminated piezoelectric body and closer to the second end surface. The ground electrode is disposed on at least one of the first through fourth side surfaces of the laminated piezoelectric body.

A plurality of exciting electrodes includes a first group which is connected to the input electrode, a second group which is connected to the output electrode, and a third group which is connected to the ground electrode. The first and second multi-mode piezoelectric bulk wave filters are cascaded and arranged so that the distance between the ground electrodes of the first and second multi-mode piezoelectric bulk wave filters is smaller than the distance between the input electrodes of the first and second multi-mode piezoelectric bulk wave filters and the distance between the output electrodes of the first and second multi-mode piezoelectric bulk wave filters to each other.

The multi-mode piezoelectric bulk wave filter according to the first preferred embodiment is not limited to a particular vibration mode. The multi-mode piezoelectric bulk wave filter may use a length vibration node or a thickness vibration mode.

Preferably, the longitudinally coupled multi-mode piezoelectric bulk wave filter device further includes a reflective layer, which is connected to the first and second end surfaces of the laminated piezoelectric body and is preferably fabricated of a material having an acoustic impedance $Z_2$ lower than an acoustic impedance $Z_1$ of the piezoelectric material of the laminated piezoelectric body.

Support members are connected to the surfaces of the reflective layers opposite from the surfaces thereof connected to the first and second end surfaces of the laminated piezoelectric body and are preferably fabricated of a material having a acoustic impedance $Z_3$ higher than the acoustic impedance $Z_2$ of the reflective layers.

In this arrangement, a vibration transferred to the reflective layer from the laminated piezoelectric body is reflected from the boundary between the reflective layer and the support member. The support member thus mechanically supports the laminated piezoelectric body without affecting the vibration characteristics of the laminated piezoelectric body. The vibration mode of the laminated piezoelectric body is thus subject to less constraints.

In a second preferred embodiment of the present invention, a longitudinally coupled multi-mode piezoelectric bulk wave filter includes at least four exciting electrodes extending substantially parallel to each other and a laminated piezoelectric body, including a plurality of piezoelectric layers arranged between the exciting electrodes, and is polarized in a direction that is substantially perpendicular to or substantially parallel to the exciting electrodes. The laminated piezoelectric body has first and second end surfaces facing in a direction that is substantially perpendicular to the plurality of the piezoelectric layers and first through fourth side surfaces connecting the first and second end surfaces.

An input electrode is disposed on the first side surface of the laminated piezoelectric body closer to the first end surface. An output electrode is disposed on the first side surface of the laminated piezoelectric body closer to the second end surface. A ground electrode is disposed on the second side surface of the laminated piezoelectric body opposite from the first side surface.

A plurality of exciting electrodes includes a first group which is connected to the input electrode, a second group which is connected to the output electrode, and a third group which is connected to the ground electrode.

Vibration modes of different orders of harmonic waves are excited and coupled in response to an input signal input between the input electrode and the ground electrode so that an output signal is output between the output terminal and the ground terminal.

First and second reflective layers are respectively arranged on the first and second end surfaces of the laminated piezoelectric body and have an acoustic impedance $Z_2$ lower than an acoustic impedance $Z_1$ of the laminated piezoelectric body.

First and second support members are respectively arranged on the first and second reflective layers and have an acoustic impedance $Z_3$ higher than the acoustic impedance $Z_2$ of the reflective layers.

A capacitor unit is located on the first support member and/or the second support member so that the capacitor unit is connected between the ground electrode and one of the output electrode and the input electrode.

The capacitor unit may be constructed in a variety of forms. Preferably, the capacitor unit includes a pair of capacitor electrodes respectively disposed on a pair of external opposed surfaces of the support member.

Preferably, the capacitor unit includes a plurality of internal electrodes being laminated with each other with the support member layers interposed therebetween.

The multi-mode piezoelectric bulk wave filter according to the second preferred embodiment is not limited to a particular vibration mode. The multi-mode piezoelectric bulk wave filter may use a length vibration mode or a thickness vibration mode.

In a third preferred embodiment of the present invention, an electronic component includes a casing substrate, the longitudinally coupled multi-mode piezoelectric bulk wave filter according to the second preferred embodiment mounted on the casing substrate, and a cap member secured to the casing substrate such that the cap surrounds the piezoelectric bulk wave filter.

In a fourth preferred embodiment of the present invention, a longitudinally coupled multi-mode piezoelectric bulk wave filter device includes first and second multi-mode piezoelectric bulk wave filters which are designed so that vibration modes of different orders of harmonic waves are excited and coupled to provide an output signal between an output electrode and a ground electrode when an input signal is input between an input electrode and the ground electrode. Each of the first and second multi-mode piezoelectric bulk wave filters includes at least four exciting electrodes extending substantially parallel to each other and a laminated piezoelectric body, including a plurality of piezoelectric layers arranged between the exciting electrodes and polarized in a direction substantially perpendicular to or substantially parallel to the exciting electrodes.

The laminated piezoelectric body has first and second end surfaces facing in a direction that is substantially perpendicular to the plurality of the piezoelectric layers and first through fourth side surfaces connecting the first and second end surfaces.

The input electrode is disposed on at least one of the first through fourth side surfaces of the laminated piezoelectric body closer to the first end surface. The output electrode is disposed on at least one of the first through fourth side surfaces of the laminated piezoelectric body closer to the second end surface. The ground electrode is disposed on at least one of the first through fourth side surfaces of the laminated piezoelectric body.

The plurality of exciting electrodes includes a first group which is connected to the input electrode, a second group which is connected to the output electrode, and a third group which is connected to the ground electrode.

The first and second multi-mode piezoelectric bulk wave filters are cascaded, and the order of the harmonic waves of the mode used by the first longitudinally coupled multi-mode piezoelectric bulk wave filter is different from the order of the harmonic waves of the mode used by the second longitudinally coupled multi-mode piezoelectric bulk wave filter.

In a fifth preferred embodiment of the present invention, a longitudinally coupled multi-mode piezoelectric bulk wave filter device includes first and second multi-mode piezoelectric bulk wave filters which are designed so that vibration modes of different orders of harmonic waves are excited and coupled to provide an output signal between an output electrode and a ground electrode when an input signal is input between an input electrode and the ground electrode. Each of the first and second multi-mode piezoelectric bulk wave filters includes at least four exciting electrodes extending substantially parallel to each other and a laminated piezoelectric body, including a plurality of piezoelectric layers arranged between the exciting electrodes and polarized in a direction substantially perpendicular to or substantially parallel to the exciting electrodes.

The laminated piezoelectric body has first and second end surfaces facing in a direction that is substantially perpendicular to the plurality of the piezoelectric layers and first through fourth side surfaces connecting the first and second end surfaces.

The input electrode is disposed on at least one of the first through fourth side surfaces of the laminated piezoelectric body closer to the first end surface. The output electrode is disposed on at least one of the first through fourth side surfaces of the laminated piezoelectric body closer to the second end surface. The ground electrode is disposed on at least one of the first through fourth side surfaces of the laminated piezoelectric body.

The plurality of exciting electrodes includes a first group which is connected to the input electrode, a second group which is connected to the output electrode, and a third group which is connected to the ground electrode. The first and second multi-mode piezoelectric bulk wave filters are cascaded, and the first longitudinally coupled multi-mode piezoelectric bulk wave filter and the second longitudinally coupled multi-mode piezoelectric bulk wave filter have different dimensions.

The first longitudinally coupled multi-mode piezoelectric bulk wave filter and the second longitudinally coupled multi-mode piezoelectric bulk wave filter may be different in width dimensions, in length dimensions, in both width or length, or in any other dimensions.

The longitudinally coupled multi-mode piezoelectric bulk wave filter device may further include a third longitudinally coupled multi-mode piezoelectric bulk wave filter cascaded with the first and second longitudinally coupled multi-mode piezoelectric bulk wave filters. The filter device may include three or more cascaded longitudinally coupled multi-mode piezoelectric bulk wave filters.

The multi-mode piezoelectric bulk wave filter device according to the fifth preferred embodiment is not limited to a particular vibration mode. The multi-mode piezoelectric bulk wave filter may use a harmonic wave of a length or thickness vibration mode.

Preferably, the longitudinally coupled multi-mode piezoelectric bulk wave filter device further includes reflective layers connected to the first and second end surfaces of the laminated piezoelectric body and preferably fabricated of a material having a acoustic impedance $Z_2$ lower than an acoustic impedance $Z_1$ of a piezoelectric material of the laminated piezoelectric body.

Support members are connected to the surfaces of the reflective layers opposite from the surfaces thereof connected to the first and second end surfaces of the laminated piezoelectric body and are preferably fabricated of a material having a acoustic impedance $Z_3$ higher than the acoustic impedance $Z_2$ of the reflective layers. In this arrangement, a vibration transferred to the reflective layer from the laminated piezoelectric body is reflected from the boundary between the reflective layer and the support member. Because a vibration energy is trapped in a region of the boundary between the reflective layer and the support member, the support member mechanically supports the piezoelectric bulk wave filter without adversely affecting the filter characteristics.

Preferably, a groove is formed on at least one side surface of the laminated piezoelectric body of at least one of the first and second multi-mode piezoelectric bulk wave filters, and a pair of multi-mode piezoelectric bulk wave filter blocks are integrally formed on both sides of the groove. In this arrangement, at least one of the first and second multi-mode piezoelectric bulk wave filters is a two-element piezoelectric bulk wave filters including a pair of longitudinally coupled multi-mode piezoelectric bulk wave filter blocks which provides a large attenuation.

In a sixth preferred embodiment of the present invention, an electronic component includes the longitudinally coupled multi-mode piezoelectric bulk wave filter device, a casing substrate bearing the longitudinally coupled multi-mode piezoelectric bulk wave filter device, and a cap member secured to the casing substrate in such a manner that the cap surrounds the longitudinally coupled multi-mode piezoelectric bulk wave filter device.

Other features, elements, characteristics and advantages of the present invention will become more apparent from the following detailed description of preferred embodiments thereof with reference to the attached drawings.

BRIEF DESCRIPTION OF THE DRAWINGS

FIG. 11A shows the external appearance of the multi-mode piezoelectric bulk wave filter of the second preferred embodiment of the present invention, and FIGS. 11B–11D show the 12th, 11th, and 13th harmonic waves, respectively;

DESCRIPTION OF THE PREFERRED EMBODIMENTS

Preferred embodiments of the present invention will now be discussed with reference to the drawings.

Figure 1:
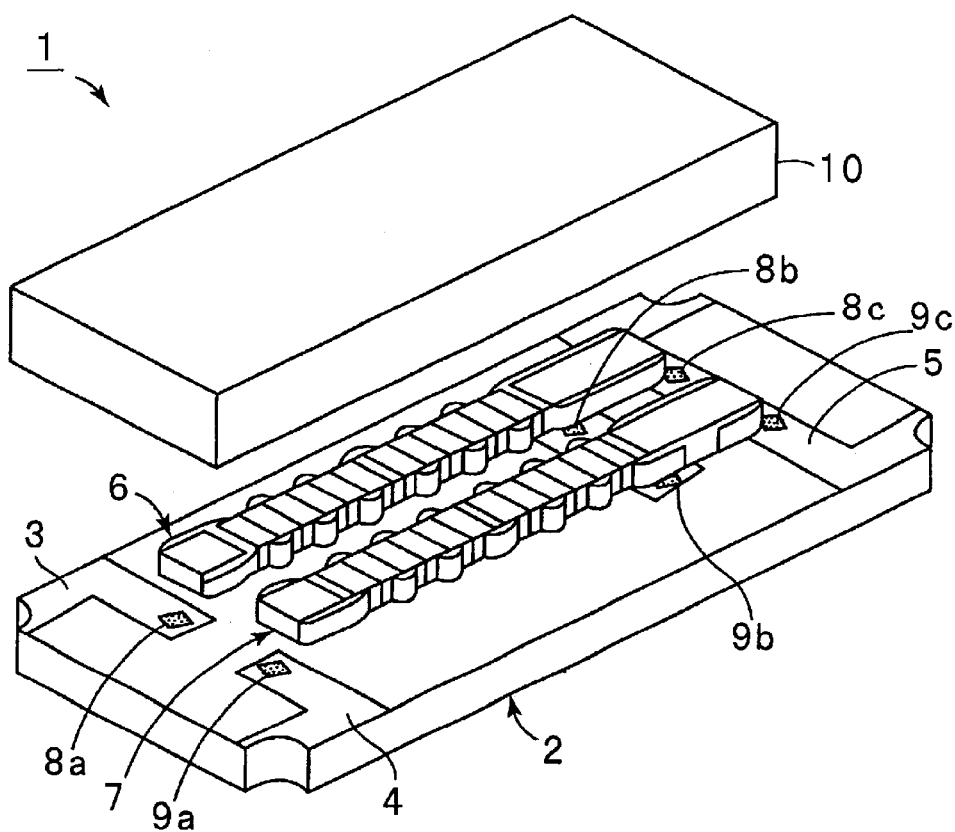
FIG. 1 is an exploded perspective view of a multi-mode piezoelectric bulk wave filter device in accordance with a first preferred embodiment of the present invention.

FIG. 1 is an exploded perspective view of a longitudinally coupled multi-mode piezoelectric bulk wave filter device 1' in accordance with a first preferred embodiment of the present invention.

The longitudinally coupled multi-mode piezoelectric bulk wave filter device 1' includes a casing substrate 2. The casing substrate 2 is fabricated of an insulating material. Located on the top of the casing substrate 2 are an input electrode 3, output electrode 4, and ground electrode 5. A first multi-mode piezoelectric bulk wave filter 6 is electrically connected and mechanically secured between the input electrode 3 and ground electrode 5 using electrically conductive adhesive agents 8a and 8c. A second multi-mode piezoelectric bulk wave filter 7 is electrically connected and mechanically secured between the output electrode 4 and ground electrode 5 using electrically conductive adhesive agents 9a and 9c. The first and second multi-mode piezoelectric bulk wave filters 6 and 7 are cascaded on the casing substrate 2. The first multi-mode piezoelectric bulk wave filter 6 and second multi-mode piezoelectric bulk wave filter 7 are also connected to each other through electrically conductive adhesive agents 8b and 9b disposed on a relay portion.

A cap member 10 is secured to the top of the casing substrate 2 to surround the first and second multi-mode piezoelectric bulk wave filters 6 and 7.

Figure 2A:
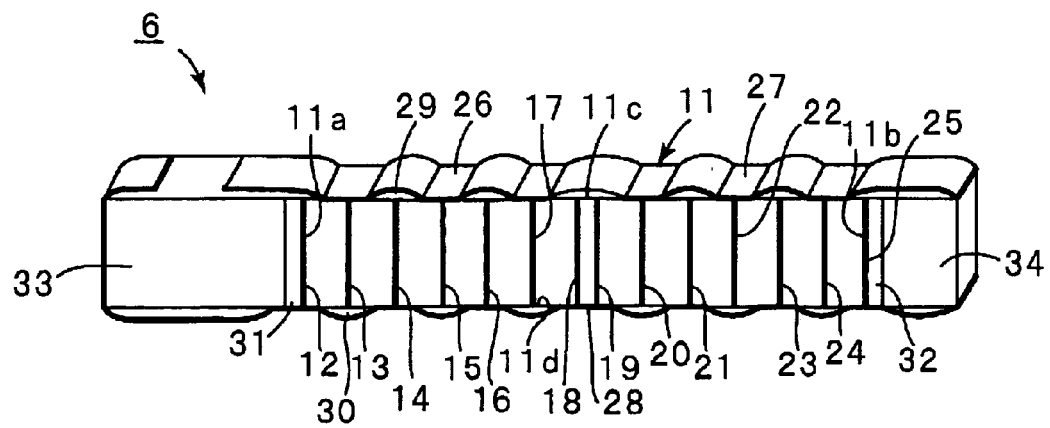
FIG. 2A is a perspective view of the multi-mode piezoelectric bulk wave filter of the first preferred embodiment of the present invention.
Figure 2B:
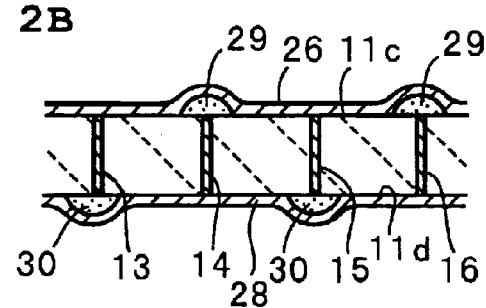
FIG. 2B is a longitudinal cross-sectional view of the multi-mode piezoelectric bulk wave filter with a portion thereof cut away.

The first and second multi-mode piezoelectric bulk wave filters 6 and 7 are preferably identical to each other in structure. Referring to FIGS. 2A and 2B, the first multi-mode piezoelectric bulk wave filter 6 will be discussed in detail.

As shown in FIG. 2A, the first multi-mode piezoelectric bulk wave filter 6 includes a laminated piezoelectric body 11. The laminated piezoelectric body 11 includes exciting electrodes 12–25 extending in a direction that is substantially perpendicular to the direction of length of the laminated piezoelectric body 11. The exciting electrodes 12 and 25 are respectively disposed on end surfaces 11a and 11b. The exciting electrodes 13–24 are internal electrodes.

Reflective layers 31 and 32 are respectively disposed on the end surfaces 11a and 11b of the laminated piezoelectric body 11. Support members 33 and 34 are respectively disposed on the external end surfaces of the reflective layers 31 and 32. The reflective layers 31 and 32 and support members 33 and 34 preferably have the same shape in cross section as the laminated piezoelectric body 11.

The bar-like laminated piezoelectric body 11, with the substantially rectangular shape in cross section, has a top surface 11c, bottom surface 11d, and side surface 11e (a rear side surface not shown) connecting the end surfaces 11a and 11b. The top surface 11c, bottom surface 11d, and side surfaces 11e constitute first through third side surfaces of the present invention. The side surface (not shown) is a fourth side surface of the present invention.

An input electrode 26 is disposed on the top surface 11a as the first side surface closer to the end surface 11a. An output electrode 27 is disposed on the laminated piezoelectric body 11 closer to the end surface 11b. A ground electrode 28 is disposed on the bottom surface 11d as the second side surface opposed from the first side surface.

A plurality of insulating materials 29 are deposited on the top surface 11a, and a plurality of insulating materials 30 are also deposited on the bottom surface 11d.

As shown in FIG. 2B, the insulating materials 29 and 30 are deposited to selectively electrically connect the exciting electrodes 12–25 to the input electrode 26, output electrode 27, and ground electrode 28.

Specifically, the exciting electrodes 13, 15, and 17 are connected to the input electrode 26, thereby forming a first group of exciting electrodes. To electrically insulate the exciting electrodes 13, 15, and 17 from the ground electrode 28, the insulating materials 30 are deposited to cover the bottom ends of the exciting electrodes 13, 15, and 17. Likewise, to electrically insulate a second group of exciting electrodes 20, 22, and 24 connected to the output electrode 27 from the ground electrode 28, the insulating materials 30 are deposited to cover the bottom ends of the exciting electrodes 20, 22, and 24.

The exciting electrodes 12, 14, 16, 18, 19, 21, 23, and 25 form a third exciting electrode group, and are electrically connected to the ground electrode 28. To electrically insulate the exciting electrodes 12, 14, 16, 18, 19, 21, 23, and 25 from the input electrode 26 and output electrode 27, the insulating materials 29 are deposited on the top surface 11c to cover the top ends of each of these electrodes.

A piezoelectric layer is sandwiched between exciting electrodes of different voltages. The piezoelectric layer sandwiched between the exciting electrode 12 and exciting electrode 13 is polarized in the direction of length of the laminated piezoelectric body 11.

In the first preferred embodiment, the piezoelectric material of the laminated piezoelectric body 11 is preferably a lead-zirconate-titanate (PZT) ceramic, and the acoustic impedance $Z_1$ thereof is about $3.4 \times 10^7$ (kg/m$^2$S).

The reflective layers 31 and 32, preferably fabricated of an epoxy resin, has an acoustic impedance $Z_2$ of about $1.87 \times 10^6$ (kg/m$^2$S). The support members 33 and 34, preferably fabricated of a ceramic, has an acoustic impedance $Z_3$ of about $3.4 \times 10^7$ (kg/m$^2$S)

The material of the reflective layers 31 and 32 is not limited to a particular one as long as the acoustic impedance $Z_2$ thereof is lower than each of the acoustic impedance $Z_1$ of then piezoelectric material of the laminated piezoelectric body 11 and the acoustic impedance $Z_3$ of the material of the support members 33 and 34.

The material of the support members 33 and 34 is not limited to any particular one as long as the acoustic impedance $Z_3$ thereof is higher than the acoustic impedance $Z_2$ of the reflective layers 31 and 32. The support members 33 and 34 may be fabricated of an insulating material other than ceramics.

Returning to FIG. 1, the first multi-node piezoelectric bulk wave filter 6 and the second multi-mode piezoelectric bulk wave filter 7 preferably having the same structure as the filter 6 are affixed on the casing substrate 2 in the longitudinally coupled multi-mode piezoelectric bulk wave filter device 1'. The piezoelectric bulk wave filter 7 and the piezoelectric bulk wave filter 6 are arranged so that the ground electrode 28 of the piezoelectric bulk wave filter 7 and the ground electrode 28 of the piezoelectric bulk wave filter 6 face each other. In other words, the distance between the ground electrodes of the piezoelectric bulk wave filters 6 and 7 is smaller than both the distance between the input electrodes of the piezoelectric bulk wave filters 6 and 7 and the distance between the output electrodes of the piezoelectric bulk wave filters 6 and 7. As will be understood from the following specific experiments, attenuation is increased in this arrangement.

The operation of the piezoelectric bulk wave filter device 1' is discussed below.

Figure 3:
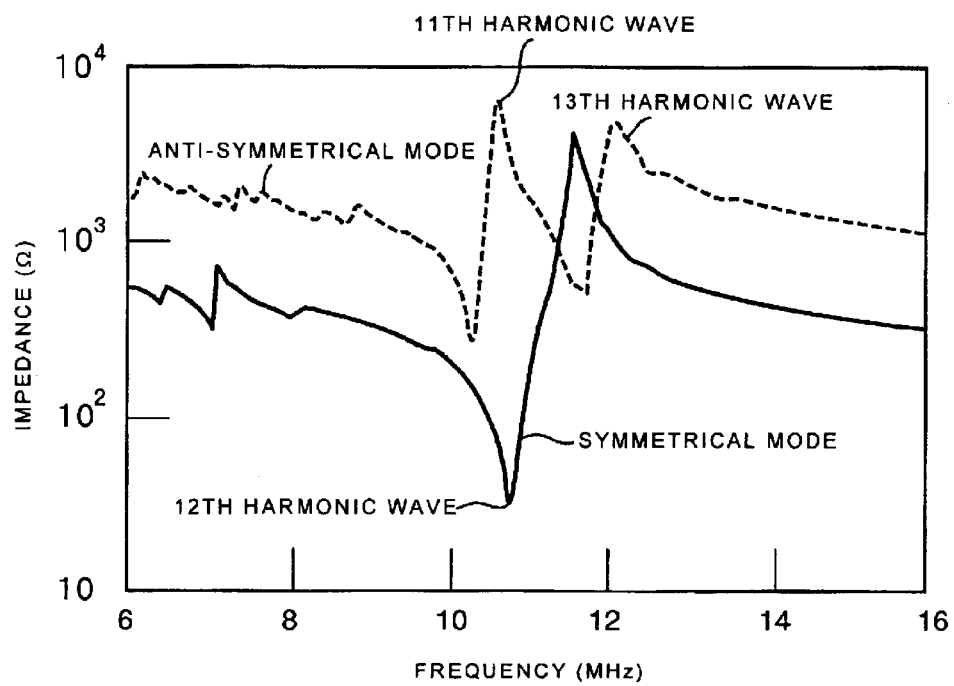
FIG. 3 shows a symmetrical mode and anti-symmetrical mode excited in the multi-mode piezoelectric bulk wave filter shown in FIGS. 2A and 2B which is mechanically supported.

FIG. 3 shows a symmetrical mode (solid line) and anti-symmetrical mode (broken line) excited when the piezoelectric bulk wave filter 6 is operated. As shown, the piezoelectric bulk wave filter 6 is strongly excited in a 12th harmonic wave in the symmetrical mode while being strongly excited in 11th and 13th harmonic waves in the anti-symmetrical mode. In other words, the piezoelectric bulk wave filter 6 is efficiently excited in 11th through 13th harmonic waves in the length vibration mode. With the 11th through 13th harmonic waves coupled, the piezoelectric bulk wave filter 6 provides filter characteristics.

Figure 4:
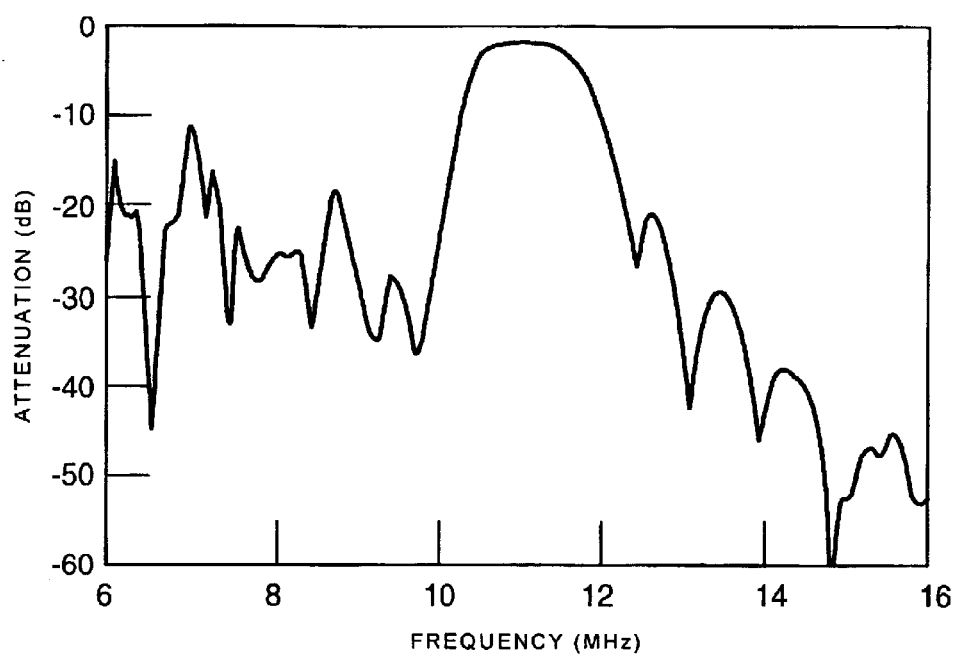
FIG. 4 shows filter characteristics of the multi-mode piezoelectric bulk wave filter shown in FIGS. 2A and 2B.

FIG. 4 shows filter characteristics of the multi-mode piezoelectric bulk wave filter 6. As shown, the piezoelectric bulk wave filter 6 results in a wide band filter characteristic with a center frequency thereof at 11 MHz.

In the multi-mode piezoelectric bulk wave filter 6, frequencies of the three modes in use are separated by the ratios of the orders of harmonics. In the transverse-coupled multi-mode filter described above, the frequency of each mode depends on a spacing between exciting electrodes. In contrast, the frequency of each mode is independent of the spacing between the exciting electrodes in the multi-mode piezoelectric bulk wave filter 6. To achieve a desired bandwidth, the order of harmonic corresponding to the bandwidth is simply selected. Filter characteristics of wide band are easily achieved. In an attempt to attain wideband in the conventional transverse-coupled multi-mode filter, the formation of segmented exciting electrodes is difficult. In contrast, the wide bandwidth is easily achieved in the piezoelectric bulk wave filter 6.

The conventional transverse-coupled multi-mode filter has a drawback that the attenuation thereof is not high enough. The attenuation of the filter is related to a ratio of a capacitance $C_{I-G}$ between an input electrode and ground potential and a capacitance $C_{I-O}$ between the input electrode and output electrode. Specifically, the smaller the capacitance between the input and output is relative to the capacitance between the input electrode and ground potential, the larger the attenuation.

Because the exciting electrodes 18 and 19 at the ground potential are arranged between the exciting electrodes connected to the input electrode 26 and output electrode 27, the capacitance between the input electrode and output electrode becomes substantially smaller. In comparison with the conventional multi-mode filter, the piezoelectric bulk wave filter 6 provides a large attenuation.

The laminated piezoelectric body 11 vibrates at a harmonic wave in the length vibration mode in the piezoelectric bulk wave filter 6. Because the laminated piezoelectric body 11 is not an energy trapped piezoelectric resonator, the direct mechanical supporting of the laminated piezoelectric body 11 adversely affects the characteristics of the piezoelectric bulk wave filter 6.

The reflective layers 31 and 32 are arranged on the outside of the end surfaces 11a and 11b, respectively, and the support members 33 and 34 are further arranged on the reflective layers 31 and 32, respectively. Because the acoustic impedances $Z_1$–$Z_3$ of the laminated piezoelectric body 11, reflective layers 31 and 32, and support members 33 and 34 are set as described above, a vibration propagating from the laminated piezoelectric body 11 is reflected from the boundaries of the reflective layers 31 and 32 and support members 33 and 34. The vibration energy is thus trapped in the central region between a pair of boundaries. Even if the piezoelectric bulk wave filter 6 is mechanically supported at the support members 33 and 34, the characteristics of the filter are free from the effect of mechanical supporting as shown in FIGS. 5 and 6.

Figure 5:
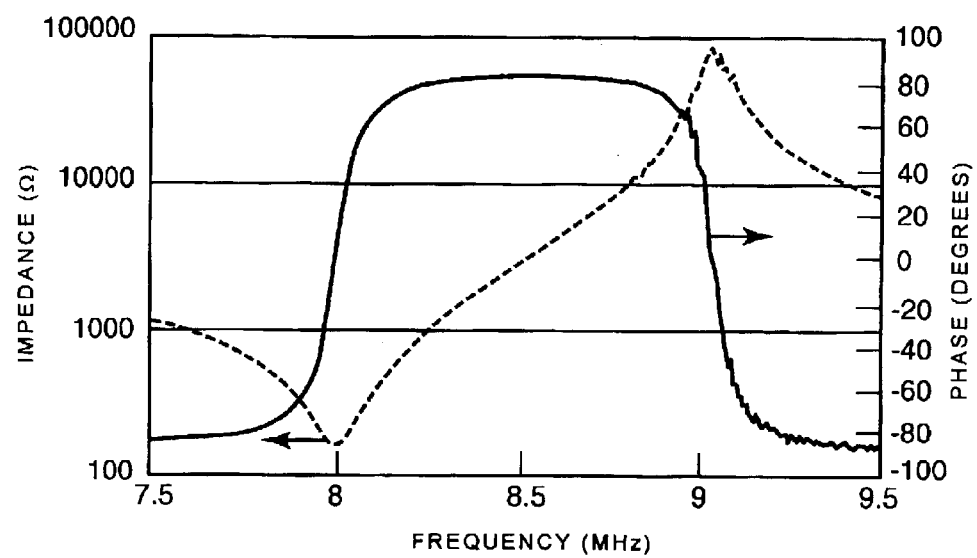
FIG. 5 shows impedance versus frequency characteristics and phase versus frequency characteristics of the multi-mode piezoelectric bulk wave filter of FIGS. 2A and 2B which is not mechanically supported.

FIG. 5 shows impedance versus frequency characteristics and phase versus frequency characteristics of the multi-mode piezoelectric bulk wave filter 6 which is not mechanically supported. FIG. 6 shows impedance versus frequency characteristics and phase versus frequency characteristics of the multi-mode piezoelectric bulk wave filter 6 which is mechanically supported at the support members 33 and 34 thereof. As shown in FIGS. 5 and 6, solid lines represent the phase versus frequency characteristics and broken lines represent the impedance versus frequency characteristics.

Figure 6:
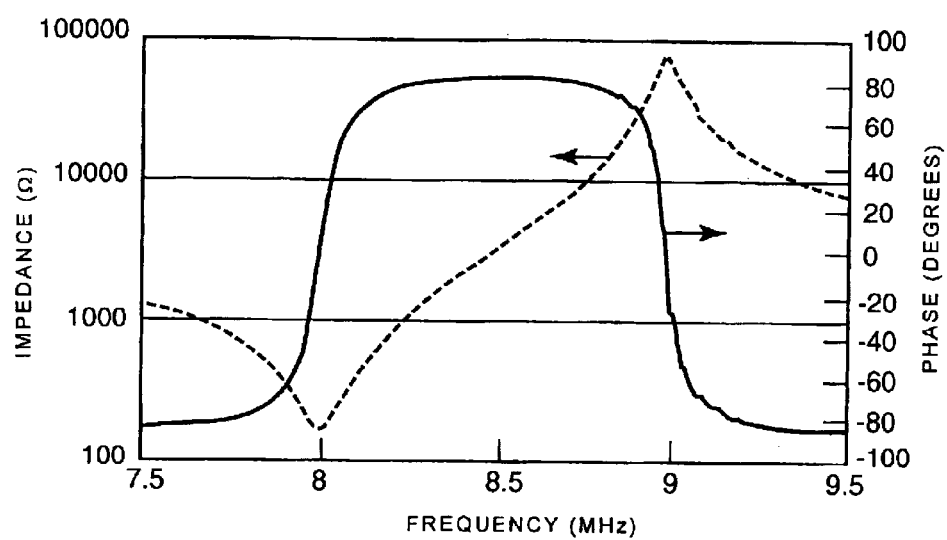
FIG. 6 shows impedance versus frequency characteristics and phase versus frequency characteristics of the multi-mode piezoelectric bulk wave filter of FIGS. 2A and 2B which is mechanically supported.

By comparison of FIG. 5 with FIG. 6, resonance characteristics are not degraded even if the piezoelectric bulk wave filter 6 is mechanically supported at the support members 33 and 34. The filter characteristics of the piezoelectric bulk wave filters 6 and 7 are not affected even if the input electrode 26, output electrode 27, and ground electrode 28 are electrically connected to and mechanically joined to the input electrode 3, output electrode 4 and ground electrode 5, respectively, on the surfaces of the support members 33 and 34 using the electrically conductive adhesive agents 8a, 8b, 8c, 9a, 9b, and 9c as shown in FIG. 1.

Returning to FIG. 1, the longitudinally coupled multi-mode piezoelectric bulk wave filter device 1' of the first preferred embodiment includes the multi-mode filters 6 and 7, each having a wide bandwidth and a large attenuation. Because the two multi-mode piezoelectric bulk wave filters 6 and 7 are cascaded, attenuation becomes large.

Because the multi-mode piezoelectric bulk wave filters 6 and 7 are arranged with the ground electrodes 28 facing each other, a further increase in attenuation results. This will be discussed with reference to FIGS. 7–9.

Figure 7:
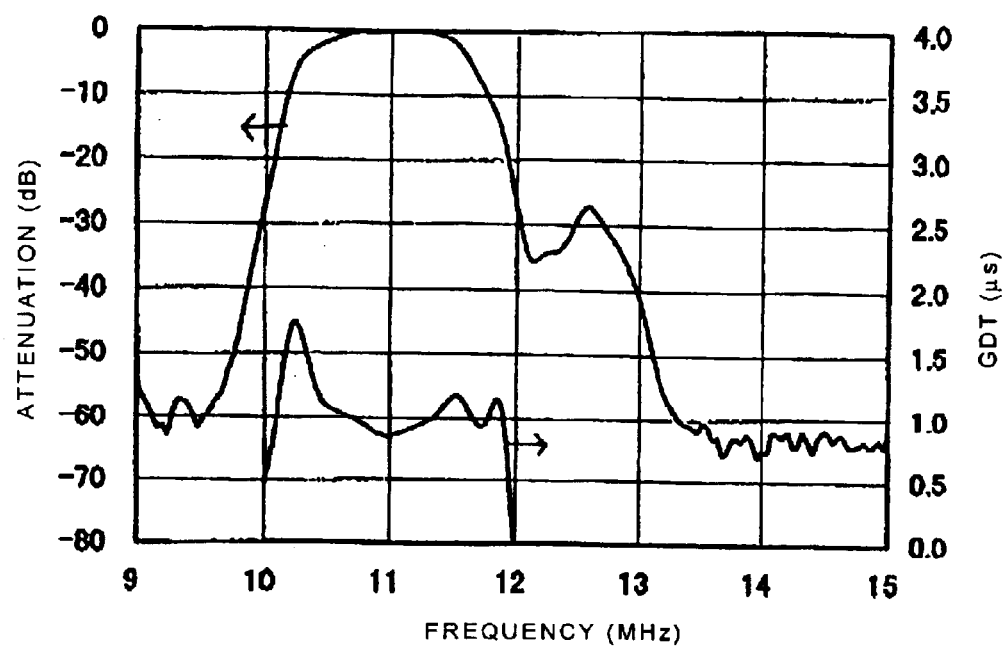
FIG. 7 shows filter characteristics of the multi-mode piezoelectric bulk wave filter device of the first preferred embodiment of the present invention.
Figure 8:
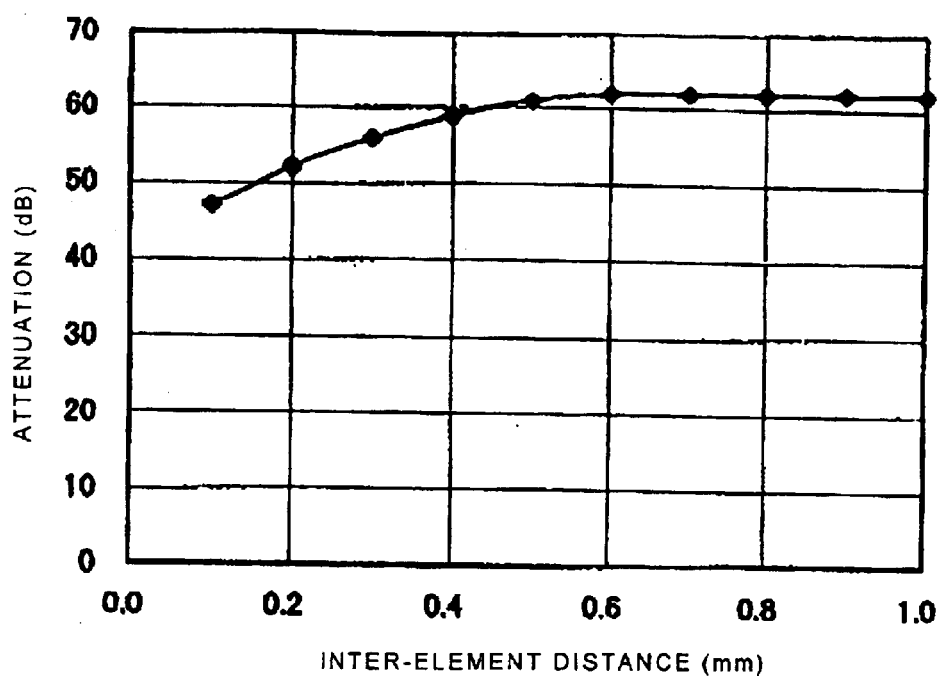
FIG. 8 shows variations in the attenuation of first and second multi-mode piezoelectric bulk wave filters with a spacing W therebetween varied wherein the first and second multi-mode piezoelectric bulk wave filters are arranged with the input and output electrodes facing to each other.

FIG. 7 shows filter characteristics of the multi-mode piezoelectric bulk wave filter device 1' of the first preferred embodiment. FIG. 8 shows variations in the attenuation of a piezoelectric bulk wave filter device including the piezoelectric bulk wave filters 6 and 7 with a spacing W varied therebetween. This piezoelectric bulk wave filter device is preferably identical to that of the first preferred embodiment except that the piezoelectric bulk wave filters 6 and 7 are arranged with the input electrodes 26 facing each other and the output electrodes 27 facing each other. As shown, if the spacing W between the two filters 6 and 7 is equal to or less than about 0.5 mm, attenuation is lower than in the first preferred embodiment regardless of the similarity in structure.

Figure 9:
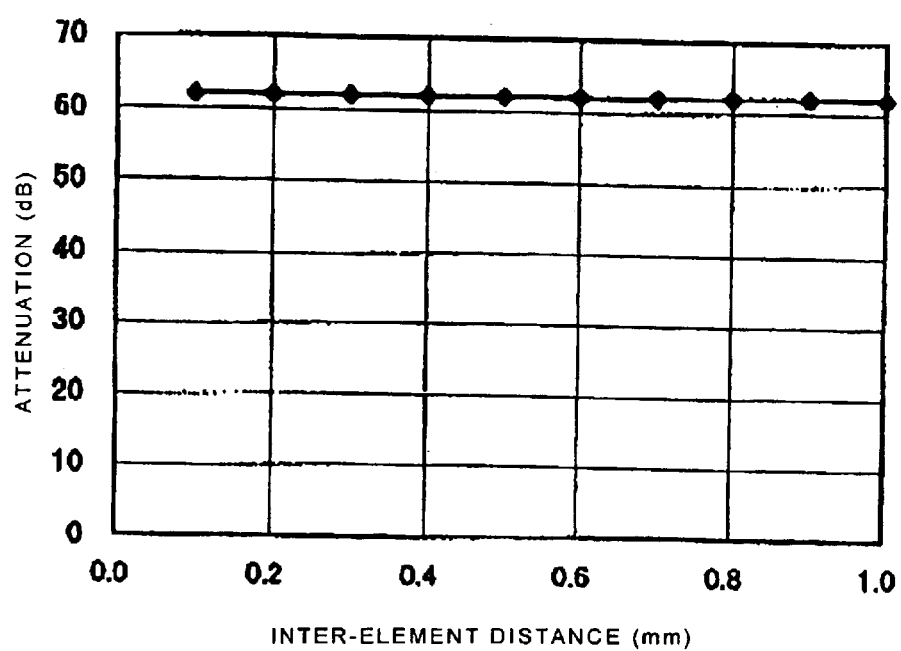
FIG. 9 shows variations in attenuation of the first and second multi-mode piezoelectric bulk wave filters with the spacing therebetween W varied in the first preferred embodiment of the present invention.

FIG. 9 shows variations in attenuation of the first and second multi-mode piezoelectric bulk wave filters 6 and 7 with the spacing W therebetween varied in the first preferred embodiment of the present invention. By comparison of FIG. 9 with FIG. 8, attenuation is high enough even with the spacing W set to be smaller because the ground electrodes 28 face each other. In the first preferred embodiment, the multi-mode piezoelectric bulk wave filters 6 and 7 use 11th through 13th harmonic waves of the thickness vibration. The order of harmonic is selected depending on a desired filter passband.

The uniformity in thickness of the piezoelectric layers between the exciting electrodes connected to different potentials is not necessarily required. By making the piezoelectric layers different from one to another in a portion thereof, the excitation efficiency in an order of harmonic causing spurious vibration is reduced.

Figure 10:
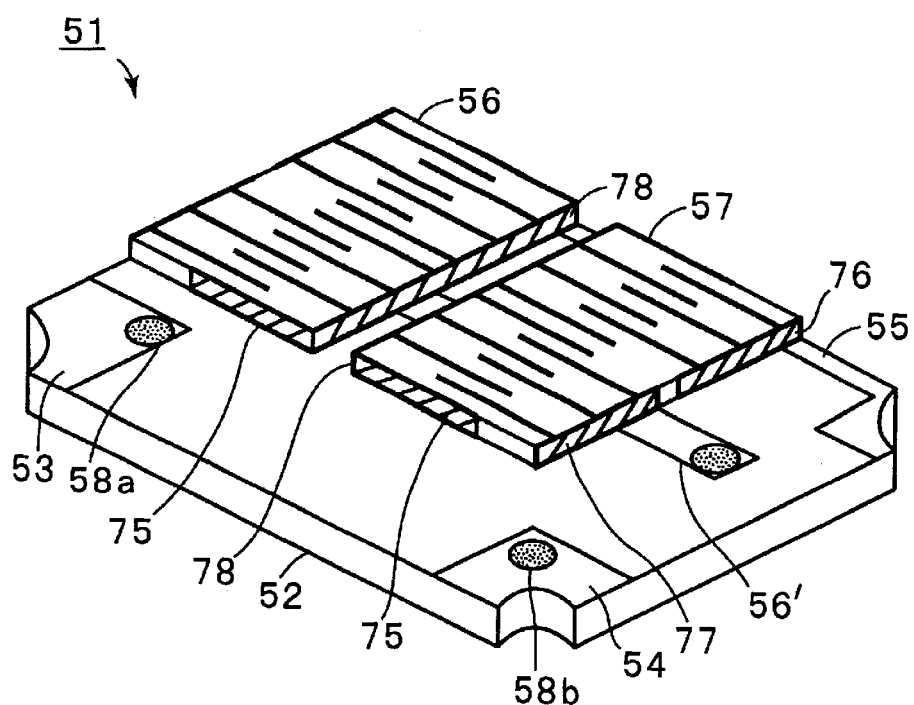
FIG. 10 is an exploded perspective view showing the multi-mode piezoelectric bulk wave filter device in accordance with a second preferred embodiment of the present invention.

FIG. 10 is an exploded perspective view showing the multi-mode piezoelectric bulk wave filter in accordance with a second preferred embodiment of the present invention. The first preferred embodiment of the present invention incorporates the piezoelectric bulk wave filter using the harmonic waves of the length vibration mode. The present invention allows a piezoelectric bulk wave filter using another vibration mode to be used.

A piezoelectric bulk wave filter device 51 shown in FIG. 10 uses a harmonic wave of the thickness vibration. Arranged on a casing substrate 52 are energy trapped multi-mode piezoelectric bulk wave filters 56 and 57 using a harmonic wave of the thickness vibration mode. An input electrode 53, output electrode 54, and ground electrode 55 are disposed on the casing substrate 52. The multi-mode piezoelectric bulk wave filters 56 and 57 are electrically connected to and mechanically fixed to the input electrode 53 and output electrode 54 using electrically conductive adhesive agents 58a and 58b. The ground electrode 55 is connected to ground electrodes (to be discussed later) of the multi-mode piezoelectric bulk wave filters 56 and 57 using electrically conductive adhesive agents (not shown). An interconnect electrode 56' is used connect the multi-mode piezoelectric bulk wave filter 56 to multi-mode piezoelectric bulk wave filter 57.

The multi-mode piezoelectric bulk wave filters 56 and 57 are preferably identical to each other in construction.

Referring to FIGS. 11A–11D, the multi-mode piezoelectric bulk wave filter 56 will be discussed in detail.

As shown, the multi-mode piezoelectric bulk wave filter 56 includes a laminated piezoelectric body 61. The laminated piezoelectric body 61 includes first and second end surfaces 61a and 61b opposed to each other. The laminated piezoelectric body 61 is polarized in a direction represented by an arrow P pointing from the end surface 61b to the end surface 61a. Exciting electrodes 62 and 75 are disposed on the first and second end surfaces 61a and 61b, respectively. Exciting electrodes 63–74 as internal electrodes are disposed in the laminated piezoelectric body 61. The exciting electrodes 62–75 are sandwiched with piezoelectric layers interposed therebetween. The exciting electrodes 63, 65, and 67 are routed out to a first side surface 61c and are electrically connected to an input electrode 76 which is arranged on the first side surface 61c closer to the end surface 61a. The exciting electrodes 70, 72, and 74 in a second group are routed out to the first side surface 61c and are electrically connected to an output electrode 77. The output electrode 77 is arranged on the first side surface 61c closer to the end surface 61b. The exciting electrodes 62, 64, 66, 68, 69, 71, 73, and 75 in a third group are electrically connected to a ground electrode 78 which is disposed on a side surface 61d.

The piezoelectric layer sandwiched between the exciting electrodes connected to different potentials (for example, the piezoelectric layer sandwiched between the exciting electrode 62 and exciting electrode 63) is excited in a thickness vibration. The harmonic waves of the thickness longitudinal vibration are trapped in the piezoelectric layer between the exciting electrode 62 and exciting electrode 63.

During operation, the multi-mode piezoelectric bulk wave filter 56 is efficiently excited in a 12th harmonic wave of the thickness vibration in the symmetrical mode shown in FIG. 11B, while being excited in 11th and 13th harmonic waves of the thickness vibration in the anti-symmetrical mode shown in FIGS. 11C and 11D.

The multi-mode piezoelectric bulk wave filter 56 provides filter characteristics with the 11th through 13th harmonic waves coupled.

In the second preferred embodiment, the multi-mode piezoelectric bulk wave filters 56 and 57 define an energy trapped multi-mode piezoelectric bulk wave filter as described above. Vibration energy is trapped in regions where the exciting electrodes 62–75 face each other. Even if the side surfaces 61c and 61d are fixed to the casing substrate 52, the filter is not adversely affected.

As in the first preferred embodiment, the bandwidth is easily adjusted for a desired passband by selecting the orders of harmonic waves. in the second preferred embodiment. Because the multi-mode piezoelectric bulk wave filters 56 and 57 are arranged with the ground electrodes 78 facing each other as shown in FIG. 10, a stop band attenuation becomes sufficiently high.

Figure 12:
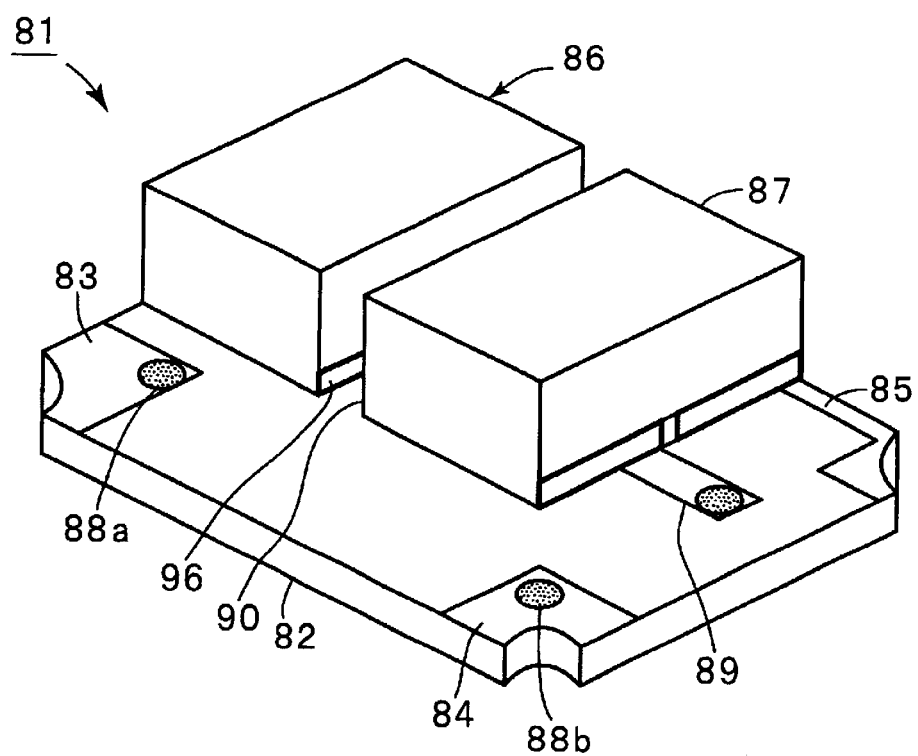
FIG. 12 is an exploded perspective view of the multi-mode piezoelectric bulk wave filter device in accordance with a third preferred embodiment of the present invention.

FIG. 12 is an exploded perspective-view of the multi-mode piezoelectric bulk wave filter device 81 in accordance with a third preferred embodiment of the present invention.

The multi-mode piezoelectric bulk wave filter device 81 includes multi-mode piezoelectric bulk wave filters 86 and 87 disposed on a casing substrate 82. An input electrode 83, output electrode 84, and ground electrode 85 are disposed on the casing substrate 82. The multi-mode piezoelectric bulk wave filters 86 and 87 are electrically connected to the input electrode 83 and output electrode 84 using electrically conductive adhesive agents 88a and 88b, respectively. The ground electrode 85 is electrically connected to the multi-mode piezoelectric bulk wave filters 86 and 87 using electrically conductive adhesive agents (not shown). An interconnect electrode 89 is used to cascade the multi-mode piezoelectric bulk wave filters 86 and 87.

Figure 13:
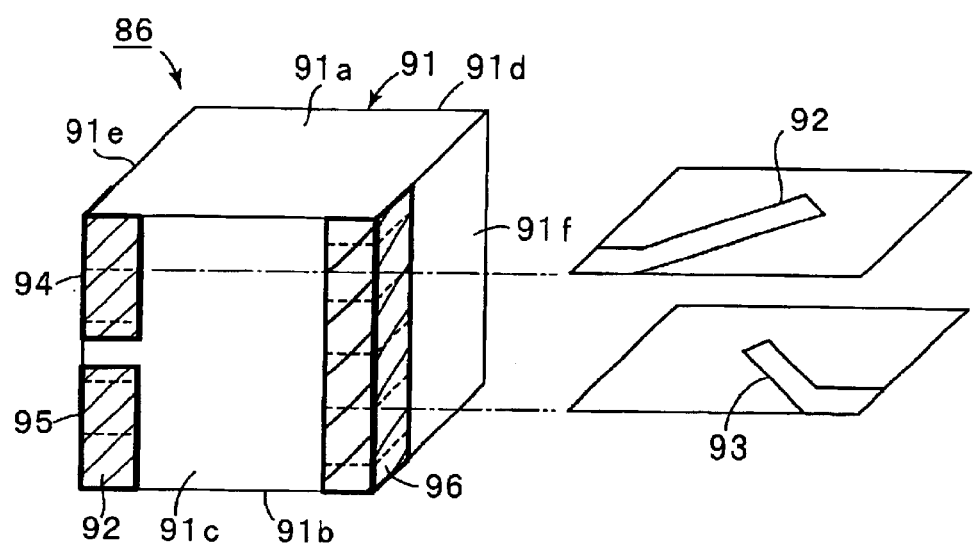
FIG. 13 is a perspective view showing the multi-mode piezoelectric bulk wave filter of the third preferred embodiment of the present invention.

As shown in FIG. 13, the multi-mode piezoelectric bulk-wave filter 86 includes a laminated piezoelectric body 91. Exciting electrodes 92 and 93, shown in the right-hand portion of FIG. 13, are alternately arranged with piezoelectric layers sandwiched therebetween in the laminated piezoelectric body 91. A top surface 91a and bottom surface 91b of the laminated piezoelectric body 91 define first and second end surfaces, respectively. Arranged on an edge portion where the first side surface 91c and third side surface 91e meet are an input electrode 94 closer to the top surface 91a and an output electrode 95 closer to the bottom surface 91b.

A ground electrode 96 is arranged on the full height of the edge portion where the first side surface 91c and fourth side surface 91f meet. The side surface 91d is the second side surface.

Figure 14:
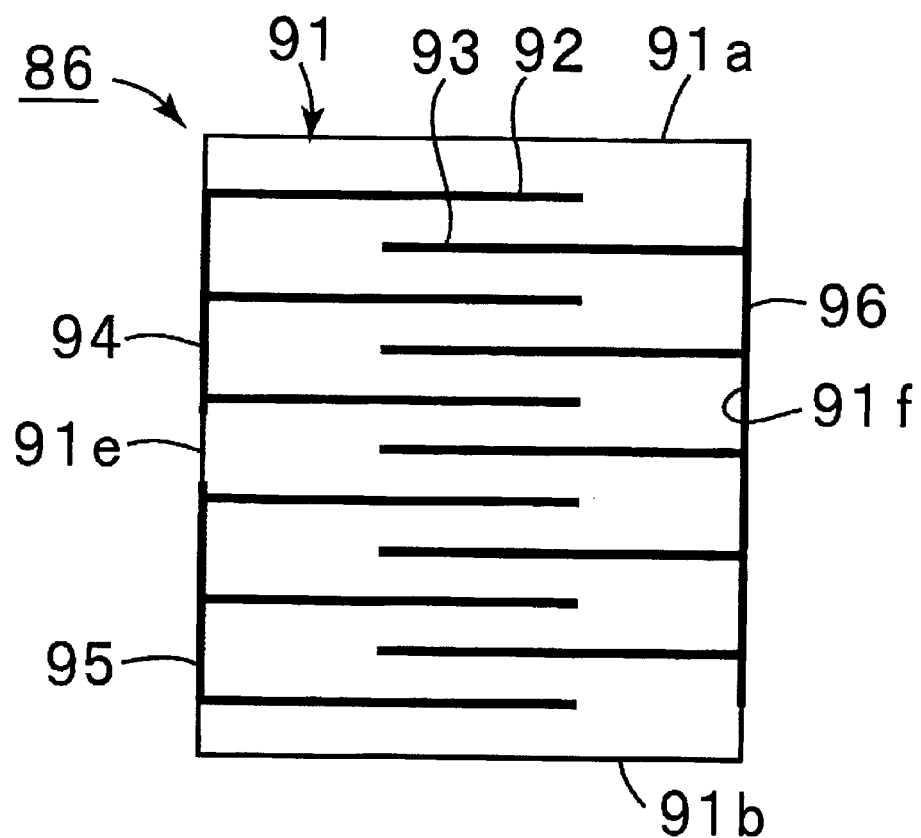
FIG. 14 is a frontal cross-sectional view showing the structure of electrodes of the multi-mode piezoelectric bulk wave filter of FIG. 13.

FIG. 14 shows the structure of electrodes of the multi-mode piezoelectric bulk wave filter 91.

In the third preferred embodiment, the laminated piezoelectric body 91 is polarized in the thickness direction. Because ten piezoelectric layers are sandwiched between exciting electrodes connected to different potentials, the multi-mode piezoelectric bulk wave filter 86 is excited in a 10th harmonic wave of the thickness vibration in the symmetrical mode, while being excited in the 11th and 13th harmonic waves in the anti-symmetrical mode. In the third preferred embodiment, the exciting electrodes 92 and 93 coextend with each other only in the center region of the laminated piezoelectric body 91 and extend substantially parallel with the end surfaces 91a and 91b of the laminated piezoelectric body 91 with the piezoelectric layer interposed therebetween. The vibration energy is thus trapped in the center region of the laminated piezoelectric body 91. In the construction of the energy trapped multi-mode piezoelectric bulk wave filter, the shape of the exciting electrode may be changed as necessary.

In the third preferred embodiment, the exciting electrodes 92 and 93 are arranged so that the two electrodes face each other in the center portions thereof with the piezoelectric layer sandwiched therebetween. More freedom is permitted in the design of the electrode structure. The laminated piezoelectric body 91 is thus mechanically strengthened. A high-frequency design is thus easily implemented.

Because the multi-mode piezoelectric bulk wave filters 86 and 87 are arranged with the ground electrodes 96 closer to each other as shown in FIG. 12, the third preferred embodiment results in a sufficiently high attenuation as the first preferred embodiment.

Figure 15:
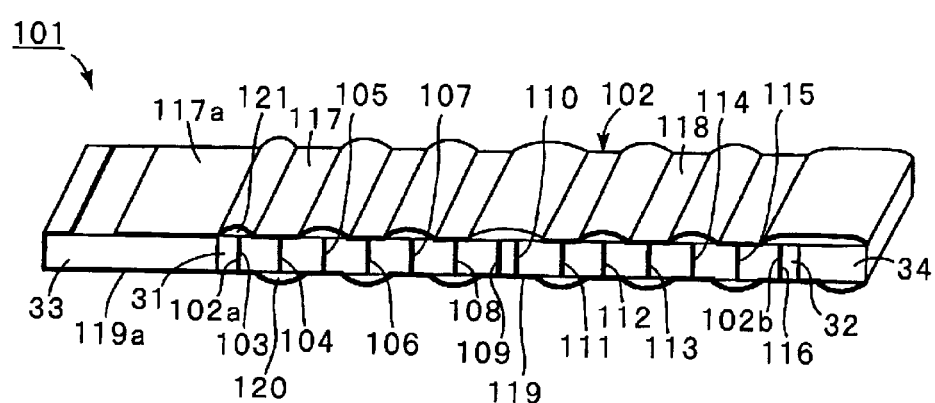
FIG. 15 is a perspective view of the multi-mode piezoelectric bulk wave filter in accordance with a fourth preferred embodiment of the present invention.

FIG. 15 is a perspective view of the multi-mode piezoelectric bulk wave filter in accordance with a fourth preferred embodiment of the present invention. A multi-mode piezoelectric bulk wave filter 101 is preferably used here.

The multi-mode piezoelectric bulk wave filter 101 includes an elongated laminated piezoelectric body 102 preferably having a substantially rectangular shape in cross section. An exciting electrode 103 is disposed on an end surface 102a of the laminated piezoelectric body 102. An exciting electrode 116 is disposed on a second end surface 102b. Exciting electrodes 104 through 115 are arranged as internal electrodes. The exciting electrodes 103 through 116 fully coextend with the cross section of the laminated piezoelectric body 102. It is acceptable that the exciting electrodes 103 through 116 coextend with only a portion of the full cross section of the laminated piezoelectric body 102.

As in the piezoelectric bulk wave filter 6 used in the first preferred embodiment, an input electrode 117 is disposed on the top surface closer to the end surface 102a and an output electrode 118 is disposed on the top surface closer to the end surface 102b. A ground electrode 119 is disposed on a bottom surface.

A plurality of insulating materials 120 and a plurality of insulating materials 121 are respectively deposited on the bottom surface and top surface of the laminated piezoelectric body 102. The insulating materials 120 are deposited to electrically insulate the exciting electrodes 104, 106, 108, 111, 113, and 115 from the ground electrode 119. Similarly, the insulating materials 121 are deposited to electrically insulate the exciting electrodes 103, 105, and 107 from the input electrode 117 and to electrically insulate the exciting electrodes 109, 110, 112, 114, and 116 from the output electrode 118.

The laminated piezoelectric body 102, preferably fabricated of a lead-zirconate-titanate ceramic, is polarized in the length direction.

When an alternating current is applied between the input electrode 117 and ground electrode 119, the laminated piezoelectric body 102 is vibrated in the length vibration mode. As in the piezoelectric bulk wave filter 6 of the first preferred embodiment, harmonic waves of the length vibration mode are efficiently excited. Specifically, the 11th through 13th harmonic waves are efficiently excited and are coupled, thereby forming a filter bandwidth.

The laminated piezoelectric body 102 of the multi-mode piezoelectric bulk wave filter 101 is preferably almost identical to the piezoelectric bulk wave filter 6 in construction.

In the fourth preferred embodiment, reflective layers 31 and 32 and support members 33 and 34 are arranged to the outside of the end surfaces 102a and 102b of the laminated piezoelectric body 102. The reflective layers 31 and 32 and support members 33 and 34 are respectively identical in construction to those of the piezoelectric bulk wave filter 6 shown in FIG. 1.

The filter characteristics of the multi-mode piezoelectric bulk wave filter 101 are not degraded even if the support members 33 and 34 are mechanically supported.

One of the unique features of the fourth preferred embodiment is that capacitor electrodes 117a and 119a are disposed on the support member 33 in the multi-mode piezoelectric bulk wave filter 101. The capacitor electrodes 117a and 119a are respectively formed by extending one end of each of the input electrode 117 and output electrode 118. The capacitor electrodes 117a and 119a, each having a certain area, are opposed to each other with the support member 33 sandwiched therebetween. A relay capacitor is thus provided between the capacitor electrodes 117a and 119a.

In the fourth preferred embodiment, the presence of the relay capacitor increases the attenuation. The relay capacitor includes the support member 33, which is not subjected to a polarization process. Even if the relay capacitor is disposed, unwanted spurious vibrations are not caused.

The multi-mode piezoelectric bulk wave filter of the fourth preferred embodiment provides a wide bandwidth, permits various bandwidths to be easily set, results in a large attenuation, and is free from unwanted spurious vibrations.

Figure 16:
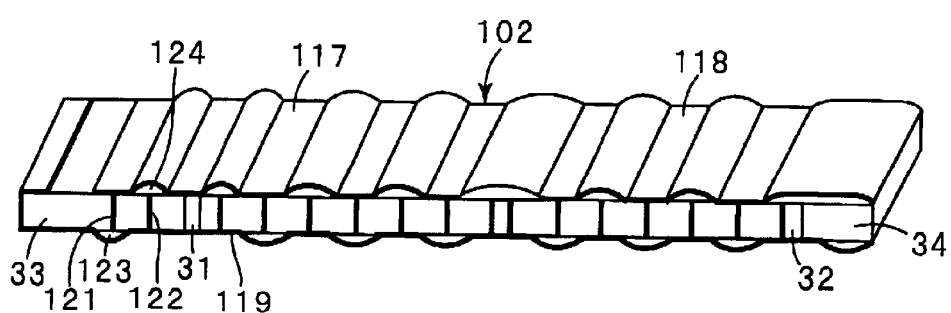
FIG. 16 is a perspective view of a modification of the multi-mode piezoelectric bulk wave filter of FIG. 15.

The relay capacitor in the multi-mode piezoelectric bulk wave filter 101 is formed by arranging the capacitor electrodes 117a and 119a on the top and bottom surfaces of the support member 33. A relay capacitor may be formed by arranging internal electrodes 121 and 122 in the support member 33 as shown in FIG. 16. The internal electrode 121 is electrically connected to the input electrode 117, and the internal electrode 122 is electrically connected to the ground electrode 119. Insulating materials 123 and 124 are deposited to electrically insulate the internal electrodes 121 and 122 from the ground electrode 119 and input electrode 117, respectively.

A relay capacitor may be formed by arranging the internal electrodes 121 and 122 in the support member 34. In this arrangement, the size of the support member 33 may be smaller than that of the preferred embodiment shown in FIG. 15.

Figure 17:
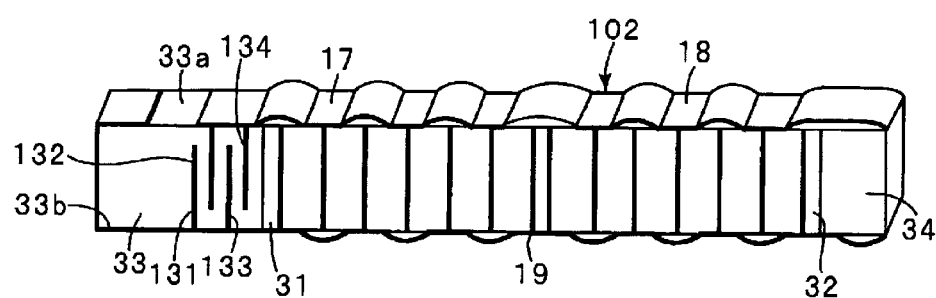
FIG. 17 is a perspective view of another modification of the multi-mode piezoelectric bulk wave filter of FIG. 15.
Figure 18:
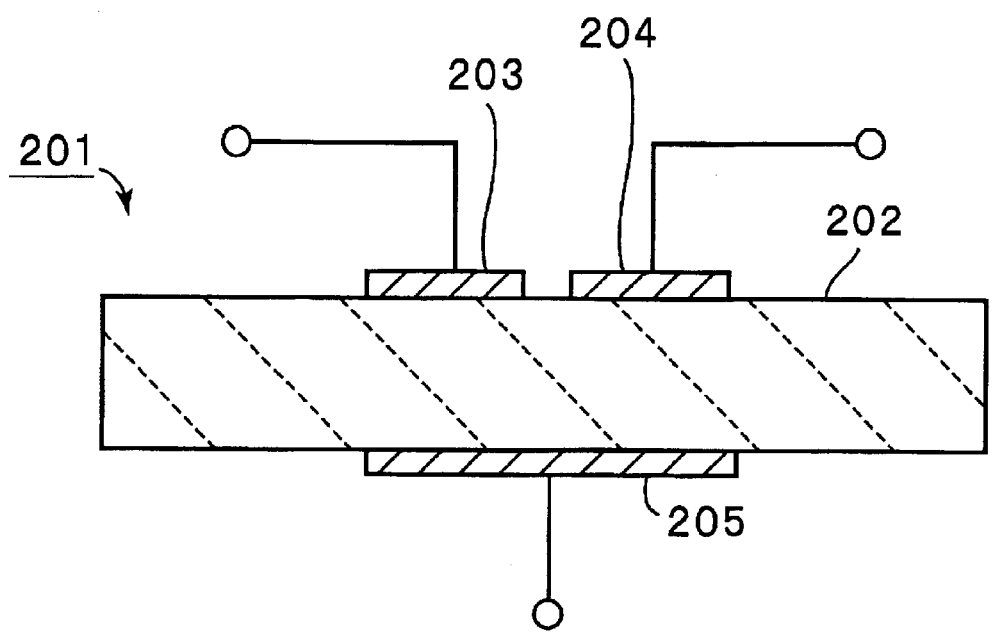
FIG. 18 is a frontal cross-sectional view of a conventional dual-mode multi-mode piezoelectric bulk wave filter.
Figure 19A:
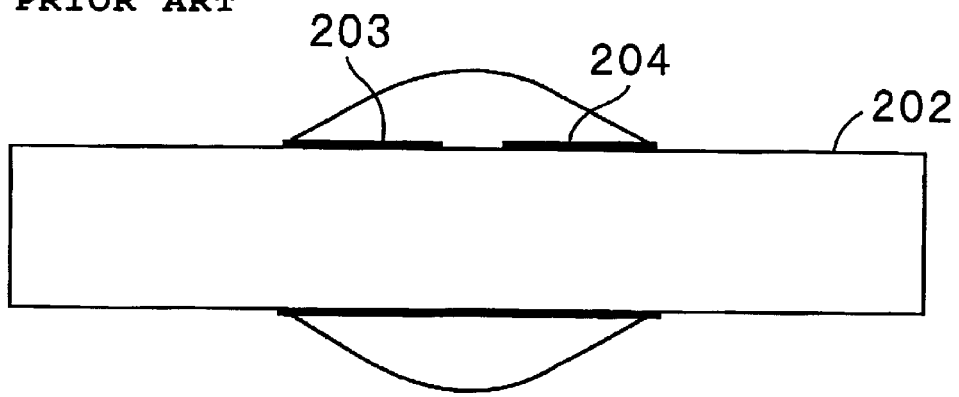
FIGS. 19A and 19B are cross-sectional views respectively showing a symmetrical mode and anti-symmetrical mode excited in the multi-mode piezoelectric bulk wave filter of FIG. 18.
Figure 19B:
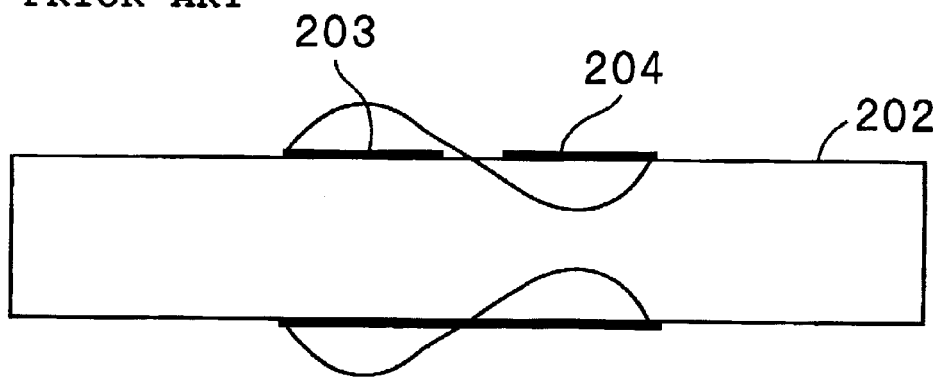
Figure 20:
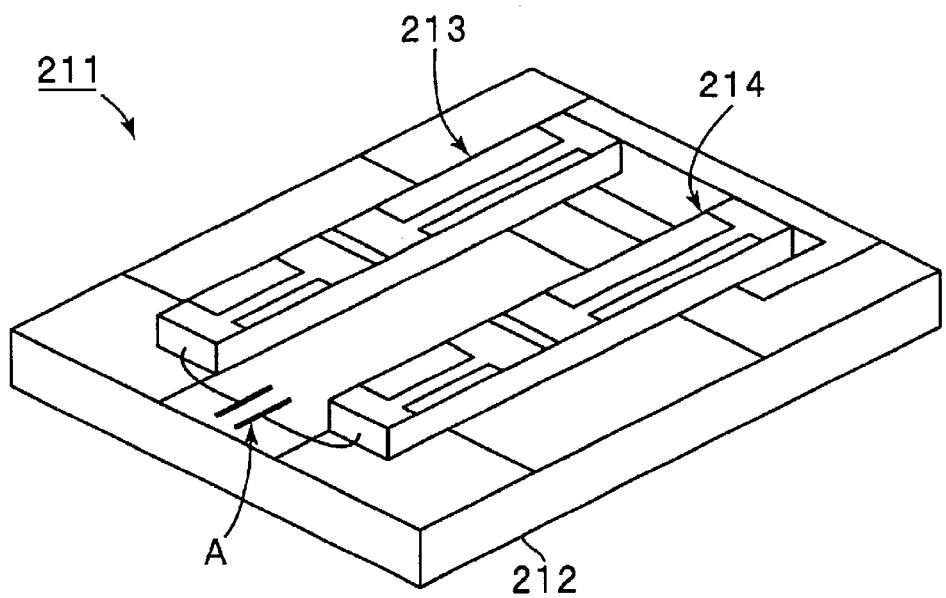
FIG. 20 is a perspective view showing a conventional multi-mode piezoelectric bulk wave filter device.
Figure 21:
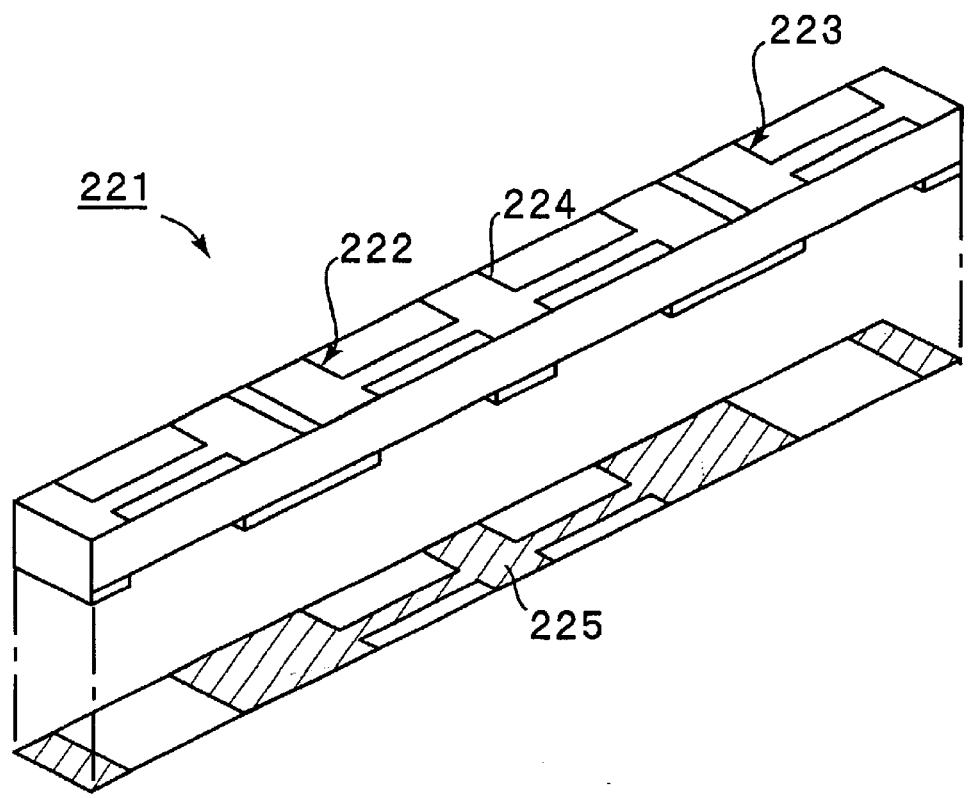
FIG. 21 is a perspective view showing another conventional multi-mode piezoelectric bulk wave filter device.
Figure 22:
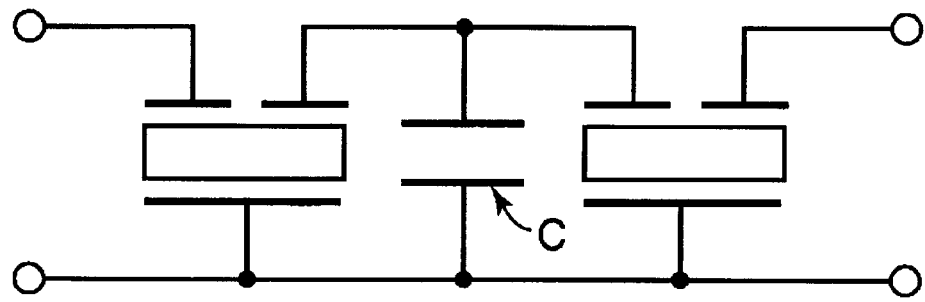
FIG. 22 shows a circuit arrangement of the multi-mode piezoelectric bulk wave filter of FIG. 21.

Referring to FIG. 17, a plurality of internal electrodes 131–134 are alternately routed out to a top surface 33a and a bottom surface 33b of the support member 33, thereby forming a relay capacitor portion of a laminated type.

In each of the first through fourth preferred embodiments and modifications thereof, each of the exciting electrodes can be kept out of contact with one of the input electrode, output electrode, and ground electrode in the same manner as in the relay capacitor portion shown in FIG. 17, rather than using the insulating materials deposited on the external surface of the piezoelectric body. In such a case, the insulating materials 120 and insulating materials 121 are dispensed with.

Figure 23:
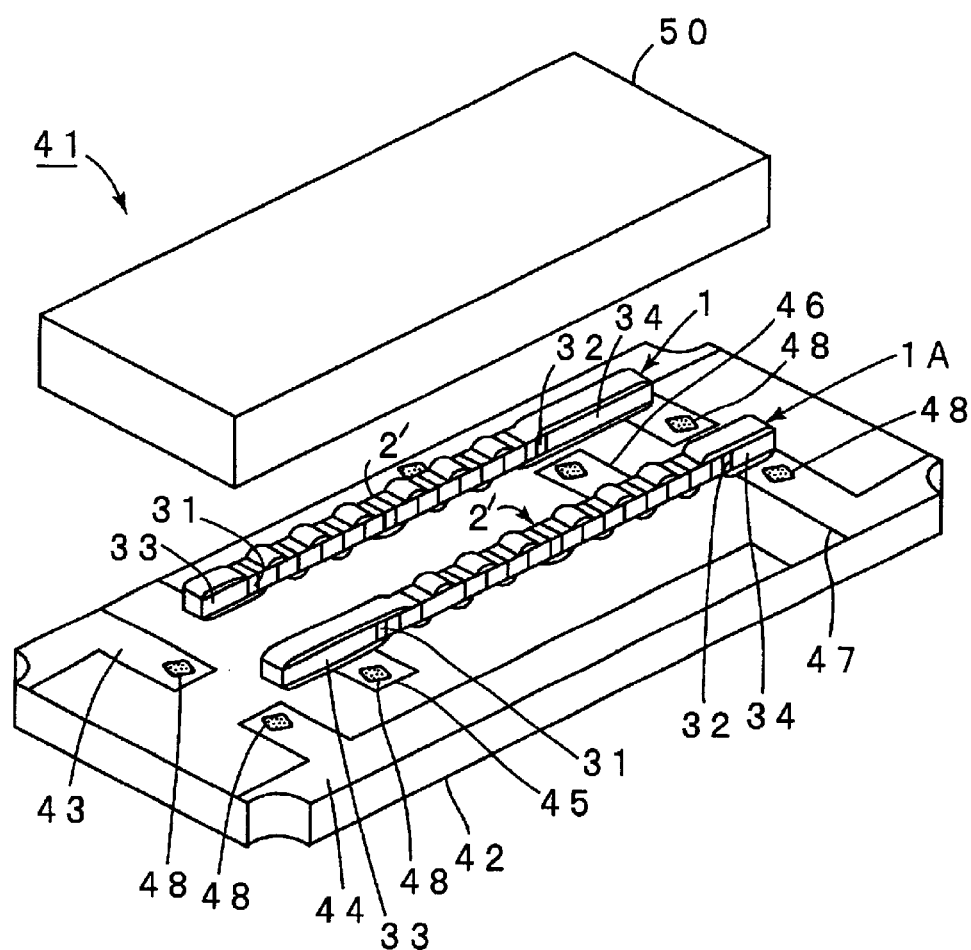
FIG. 23 is an exploded perspective view of the longitudinally coupled multi-mode piezoelectric bulk wave filter device in accordance with a fifth preferred embodiment of the present invention.

FIG. 23 is an exploded perspective view of the longitudinally coupled multi-mode piezoelectric bulk wave filter device 41 in accordance with a fifth preferred embodiment of the present invention. As shown, the longitudinally coupled multi-mode piezoelectric bulk wave filter device 41 includes two longitudinally coupled multi-mode piezoelectric bulk wave filters 1 and 1A mounted on a casing substrate 42.

Figure 24:
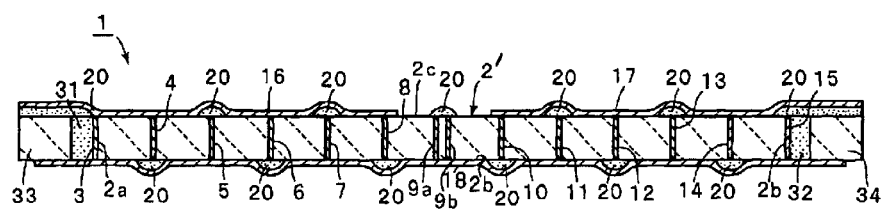
FIG. 24 is a longitudinal cross-sectional view of the longitudinally coupled multi-mode piezoelectric bulk wave filter for use in the fifth preferred embodiment of the present invention.

FIG. 24 shows the longitudinally coupled multi-mode piezoelectric bulk wave filter 1 in detail.

As shown, the multi-mode piezoelectric bulk wave filter 1 includes a laminated piezoelectric body 2'. Exciting electrodes 3–8, 9a, 9b, and 10–15 extend in a direction that is substantially perpendicular to the length of the laminated piezoelectric body 2' in the laminated piezoelectric body 2'. The exciting electrodes 3 and 15 are respectively disposed on end surfaces 2a and 2b of the laminated piezoelectric body 2'. The exciting electrodes 4–8, 9a, 9b, and 10–14 define internal electrodes.

Reflective layers 31 and 32 are disposed on the external end surfaces of the end surfaces 2a and 2b of the laminated piezoelectric body 2', respectively. Support members 33 and 34 are disposed on the external end surfaces of the reflective layers 31 and 32, respectively.

The reflective layers 31 and 32 and support members 33 and 34 preferably have the same substantially rectangular cross section as the laminated piezoelectric body 2'.

The bar-like laminated piezoelectric body 2', with the substantial rectangular shape thereof in cross section, has a top surface 2c, bottom surface 2d, side surface 2e, and a rear side surface (not shown) connecting the end surfaces 2a and 2b. The top surface 2a, bottom surface 2d, and side surfaces 2e constitute first through third side surfaces of the present invention. The side surface not shown is a fourth side surface of the present invention.

An input electrode 16 is disposed on the top surface 2c closer to the end surface 2a. An output electrode 17 is disposed on the top surface 2c closer to the end surface 2b. A ground electrode 18 is disposed on the bottom surface 2d opposed from the top surface.

A plurality of insulating materials 20 are deposited on the top surface 2a, and a plurality of insulating materials 20 are also deposited on the bottom surface 2d. The insulating materials 20 are deposited to selectively electrically connect the exciting electrodes 3–15 to the input electrode 16, output electrode 17, and ground electrode 18.

Specifically, the exciting electrodes 4, 6, and 8 are connected to the input electrode 16, thereby forming a first group of exciting electrodes. Exciting electrodes 10, 12, and 14, forming a second group, are connected to the output electrode 17. The remaining exciting electrodes 3, 5, 7, 9a, 9b, 11, 13, and 15, forming a third group, are connected to the ground electrode 18.

The insulating materials 20 are deposited on the top surface 2c to electrically insulate the exciting electrodes 3, 5, 7, 9a, 9b, 11, 13, and 15 in the third group from the input electrode 16 and output electrode 17. The insulating materials 20 are deposited on the bottom surface 2d to electrically insulate the exciting electrodes 4, 6, 8, 10, 12, and 14 from the ground electrode 18.

A piezoelectric layer sandwiched between exciting electrodes connected to different potentials (for example, the piezoelectric layer sandwiched between the exciting electrode 3 and exciting electrode 4) is polarized in the direction of length of the laminated piezoelectric body 2'. In the fifth preferred embodiment, the piezoelectric material of the laminated piezoelectric body 2' is preferably a lead-zirconate-titanate ceramic and has an acoustic impedance $Z_1$ of about $3.4 \times 10^7$ (kg/m$^2$S).

The reflective layers 31 and 32, preferably fabricated of an epoxy resin, has an acoustic impedance $Z_2$ of about $1.87 \times 10^6$ (kg/m$^2$S). The support members 33 and 34, preferably fabricated of a ceramic, has an acoustic impedance $Z_3$ of about $3.4 \times 10^7$ (kg/m$^2$S).

The material of the reflective layers 31 and 32 is not limited to a particular one, as long as the acoustic impedance $Z_2$ thereof is lower than each of the acoustic impedance $Z_1$ of the piezoelectric material of the laminated piezoelectric body 2' and the acoustic impedance $Z_3$ of the material of the support members 33 and 34. The material of the support members 33 and 34 is not limited to any particular one, as long as the acoustic impedance $Z_3$ thereof is higher than the acoustic impedance $Z_2$ of the reflective layers 31 and 32. The support members 33 and 34 may be fabricated of an insulating material other than ceramics.

The operation of the multi-mode piezoelectric bulk wave filter 1 will now be discussed.

Figure 25:
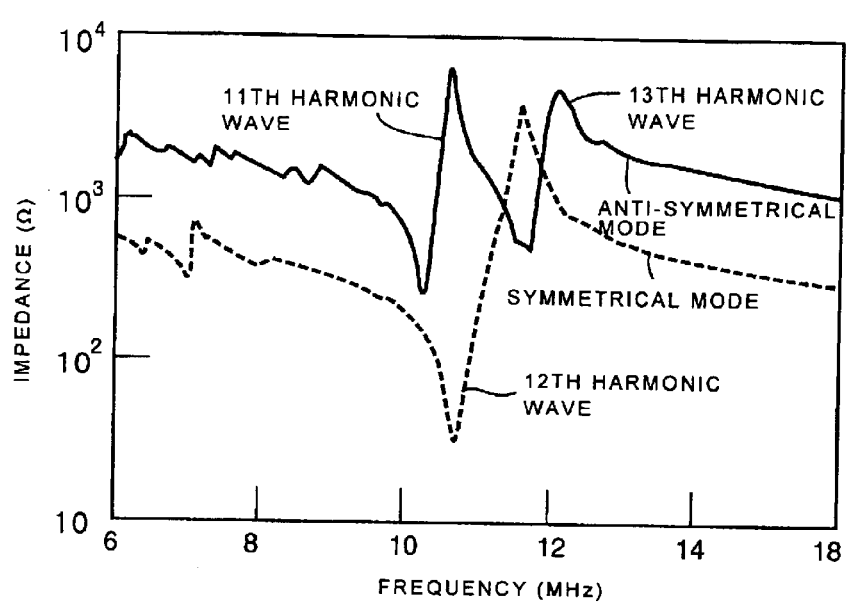
FIG. 25 shows a symmetrical mode and anti-symmetrical mode excited in a first longitudinally coupled multi-mode piezoelectric bulk wave filter.

FIG. 25 shows a symmetrical mode (broken line) and anti-symmetrical mode (solid line) excited in the multi-mode piezoelectric bulk wave filter 1. As shown, the multi-mode piezoelectric bulk wave filter 1 is strongly excited in a 12th harmonic wave in the symmetrical mode, while being strongly excited in the 11th and 13th harmonic waves in the anti-symmetrical mode. In other words, the piezoelectric bulk wave filter 1 is efficiently excited in the 11th through 13th harmonic waves in the length vibration mode based on the piezoelectric longitudinal effect.

Figure 26:
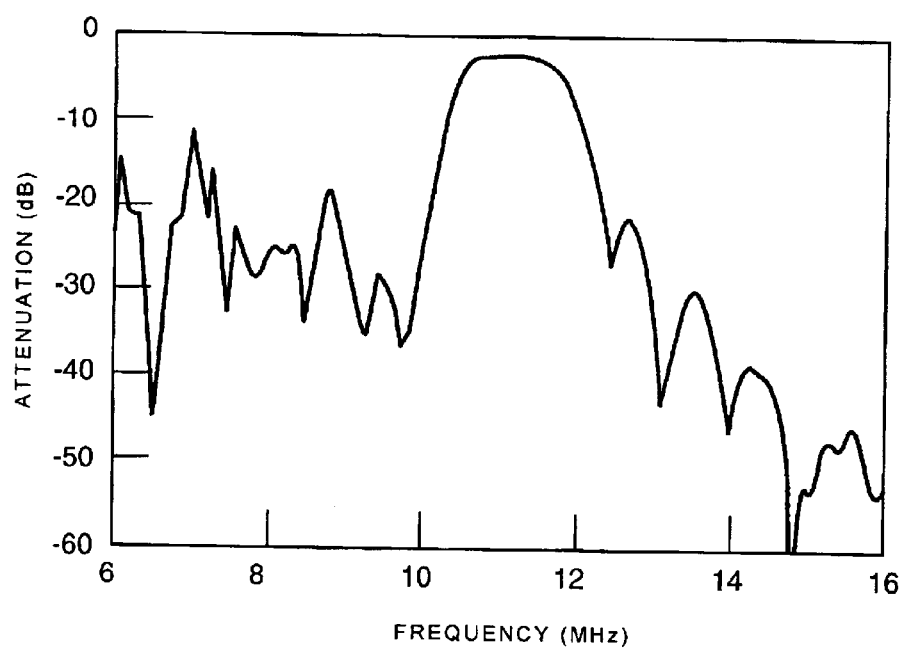
FIG. 26 shows filter characteristics of the first longitudinally coupled multi-mode piezoelectric bulk wave filter.

With the 11th through 13th harmonic waves coupled, the piezoelectric bulk wave filter 1 provides filter characteristics. FIG. 26 shows filter characteristics of the multi-mode piezoelectric bulk wave filter 1. As shown, the piezoelectric bulk wave filter 1 results in a wide filter characteristic with a center frequency thereof at 11 MHz.

In the multi-mode piezoelectric bulk wave filter 1, frequencies of the three modes in use are separated by the ratios of the orders of the harmonics. In the transverse-coupled dual-mode filter described above, the frequency of each mode depends on a spacing between exciting electrodes. In contrast, the frequency of each mode is independent of the spacing between the exciting electrodes in the multi-mode piezoelectric bulk wave filter 1. To achieve a desired bandwidth, the order of the harmonic corresponding to the desired bandwidth is simply selected. Filter characteristics of wide band are easily achieved.

In an attempt to attain wide bandwidth, the formation of segmented exciting electrodes is difficult in the conventional transverse-coupled multi-mode filter. In contrast, the wide bandwidth is easily achieved in the piezoelectric bulk wave filter 1. The conventional transverse-coupled multi-mode filter has a drawback that the attenuation thereof is not high enough. The attenuation of the filter is related to a ratio of a capacitance $C_{I-G}$ between an input electrode and ground potential and a capacitance $C_{I-O}$ between the input electrode and output electrode. Specifically, the smaller the capacitance between the input and output is to the capacitance between the input electrode and ground potential, the larger the attenuation.

Because the exciting electrodes 9a and 9b at the ground potential are arranged between the exciting electrodes respectively connected to the input electrode 16 and output electrode 17, the capacitance between the input electrode and output electrode becomes substantially smaller. In comparison with the conventional multi-mode filter, the piezoelectric bulk wave filter 1 provides a large attenuation.

The laminated piezoelectric body 2' vibrates in a harmonic wave in the length vibration mode in the piezoelectric bulk wave filter 1. Because the laminated piezoelectric body 2' is not an energy trapped piezoelectric resonator, the direct mechanical supporting of the laminated piezoelectric body 2' adversely affects the characteristics of the piezoelectric bulk wave filter 1. The reflective layers 31 and 32 are arranged on the end surfaces 2a and 2b, respectively, and the support members 33 and 34 are further arranged on the outside of the reflective layers 31 and 32, respectively. Because the acoustic impedances $Z_1$–$Z_3$ of the laminated piezoelectric body 2', reflective layers 31 and 32, and support members 33 and 34 are set as described above, a vibration propagating from the laminated piezoelectric body 2' is reflected from the boundaries of the reflective. layers 31 and 32 and support members 33 and 34. The vibration energy is thus trapped in the central region of laminated piezoelectric body 2' between the pair of boundaries.

Figure 27:
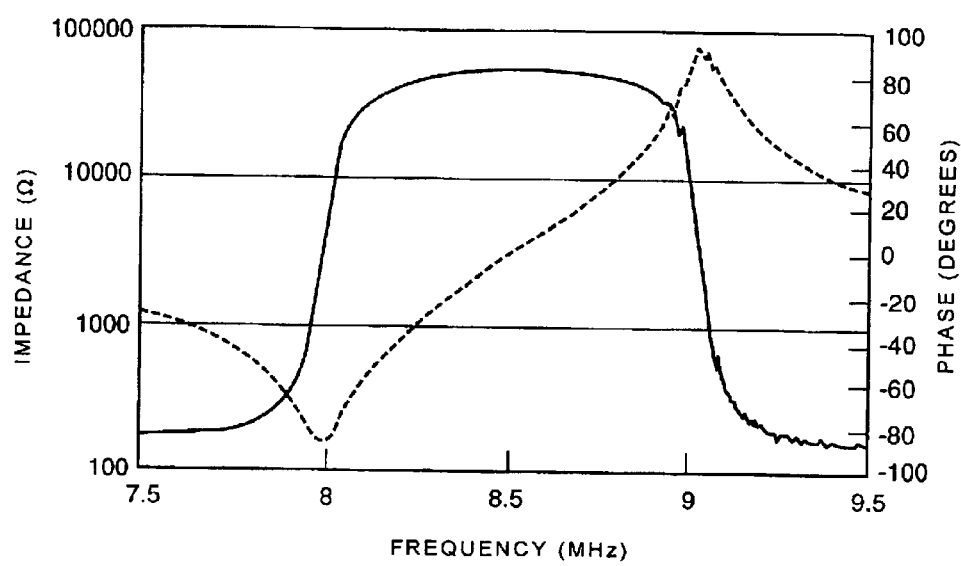
FIG. 27 shows impedance versus frequency characteristics and phase versus frequency characteristics of the first longitudinally coupled multi-mode piezoelectric bulk wave filter which is not mechanically supported.
Figure 28:
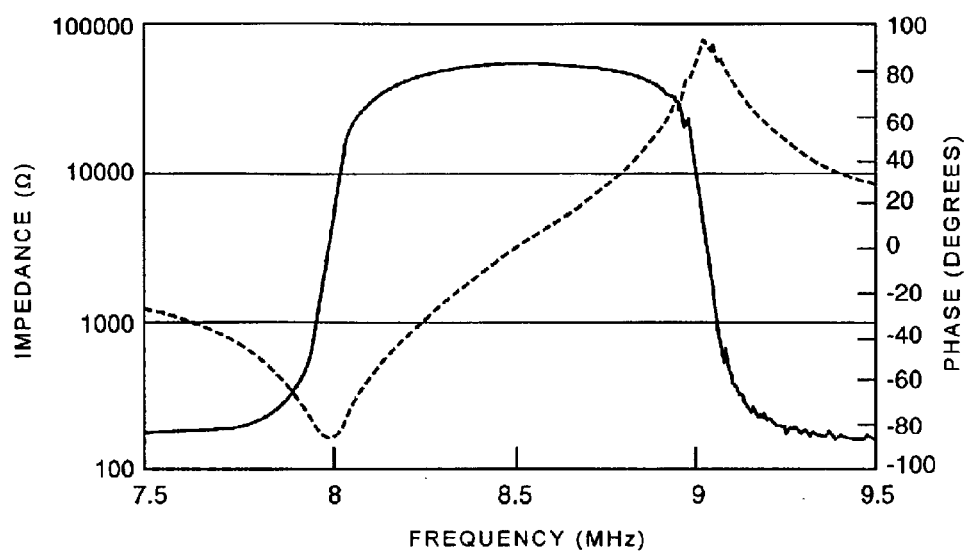
FIG. 28 shows impedance versus frequency characteristics and phase versus frequency characteristics of the first longitudinally coupled multi-mode piezoelectric bulk wave filter which is mechanically supported.

Even if the piezoelectric bulk wave filter 1 is mechanically supported at the support members 33 and 34, the characteristics of the filter are free from the effect of mechanical supporting as shown in FIGS. 27 and 28.

FIG. 27 shows impedance versus frequency characteristics and phase versus frequency characteristics of the multi-mode piezoelectric bulk wave filter 1 which is not mechanically supported at the support members 33 and 34 thereof. FIG. 28 shows impedance versus frequency characteristics and phase versus frequency characteristics of the multi-mode piezoelectric bulk wave filter 1 which is mechanically supported at the support members 33 and 34 thereof. As shown in FIGS. 27 and 28, solid lines represent the phase versus frequency characteristics and broken lines represent the impedance versus frequency characteristics. By comparison of FIG. 27 with FIG. 28, resonance characteristics are not degraded if the piezoelectric bulk wave filter 1 is mechanically supported at the support members 33 and 34.

Returning to FIG. 23, the longitudinally coupled multi-mode piezoelectric bulk wave filter device 41 of the fifth preferred embodiment includes multi-mode filters 1 and 1A, each having a wide bandwidth and a large attenuation. Two filter elements of multi-mode piezoelectric bulk wave filters 1 and 1A are mounted on the casing substrate 42. Terminal electrodes 43–47 are disposed on the top surface of the casing substrate 42. The terminal electrodes 43–47 are electrically connected to the multi-mode piezoelectric bulk wave filters 1 and 1A using electrically conductive adhesive agents 48. The terminal electrodes 43–47 are electrically connected to and mechanically to the multi-mode piezoelectric bulk wave filters 1 and 1A at the support members 33 and 34 thereof using the electrically adhesive agents 48.

The terminal electrodes 45 and 46 on the casing substrate 42 are arranged to cascade. the multi-mode piezoelectric bulk wave filters 1 and 1A.

In the fifth preferred embodiment, the multi-mode piezoelectric bulk wave filter 1 uses the 11th through 13th harmonic waves of the length vibration mode, while the multi-mode piezoelectric bulk wave filter 1A uses the 13th through 15th harmonic waves of the length vibration mode. The multi-mode piezoelectric bulk wave filter 1A is preferably identical in construction to the multi-mode piezoelectric bulk wave filter 1 except that the multi-mode piezoelectric bulk wave filter 1A includes 14 piezoelectric layers sandwiched between exciting electrodes connected to different potentials.

Because of its 14 piezoelectric layers sandwiched between exciting electrodes connected to different potentials, the multi-mode piezoelectric bulk wave filter 1A is strongly excited in a 14th harmonic wave in the symmetrical mode while being strongly excited in the 13th and 15th harmonic waves in the anti-symmetrical mode. The 13th through 15th harmonic waves are coupled, forming a filter characteristic.

The piezoelectric bulk wave filter device 41, including cascaded multi-mode piezoelectric bulk wave filters 1 and 1A, provides a larger attenuation than a device including only the multi-mode piezoelectric bulk wave filter 1 or only the multi-mode piezoelectric bulk wave filter 1A. The multi-mode piezoelectric bulk wave filter device 41 thus provides filter characteristics with excellent selectivity. The filter characteristics are now discussed with reference to FIGS. 29 through 31.

Figure 29:
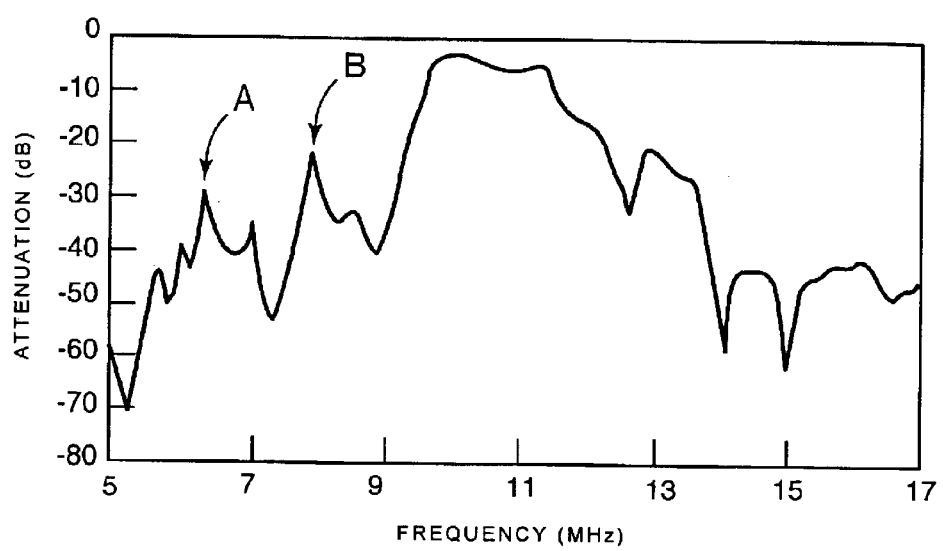
FIG. 29 shows filter characteristics of the first longitudinally coupled multi-mode piezoelectric bulk wave filter.
Figure 30:
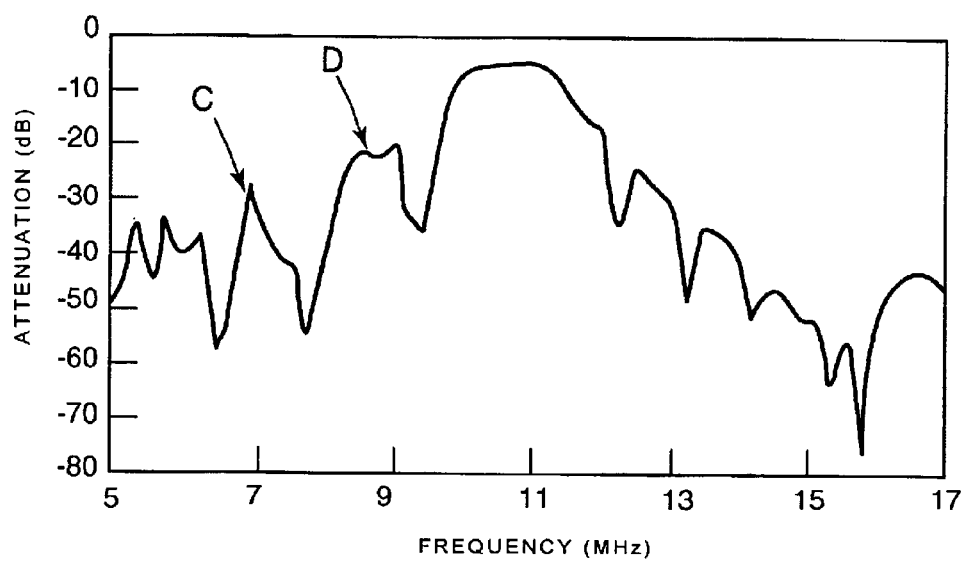
FIG. 30 shows filter characteristics of a second longitudinally coupled multi-mode piezoelectric bulk wave filter.
Figure 31:
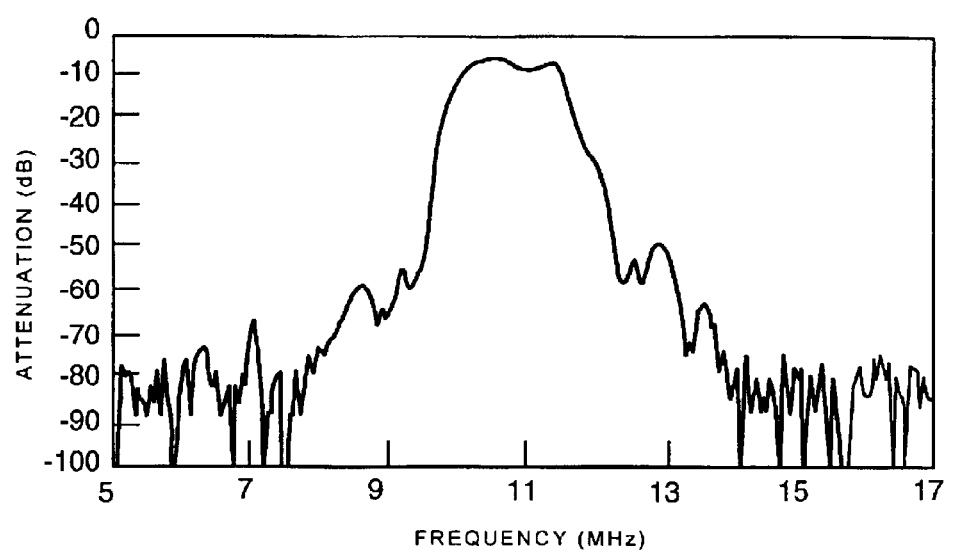
FIG. 31 shows filter characteristics of the longitudinally coupled multi-mode piezoelectric bulk wave filter device in accordance with the fifth preferred embodiment of the present invention.

FIG. 29 shows the filter characteristics of the multi-mode piezoelectric bulk wave filter 1. The thickness of the piezoelectric layer sandwiched between the internal electrodes is about 150 $\mu$m. The laminated piezoelectric body 2' in the multi-mode piezoelectric bulk wave filter 1 is for example, about 120 $\mu$m thick, about 120 $\mu$m wide, and about 3300 $\mu$m long. FIG. 30 shows the filter characteristics of the multi-mode piezoelectric bulk wave filter 1A that is identical to the multi-mode piezoelectric bulk wave filter 1 except that the multi-mode piezoelectric bulk wave filter 1A has two more piezoelectric layers connected to different potentials. FIG. 31 shows the filter characteristics of the longitudinally coupled multi-mode piezoelectric bulk wave filter device 41 including the cascaded multi-mode piezoelectric bulk wave filters 1 and 1A.

Higher order modes of harmonic waves other than those in use are excited in the multi-mode piezoelectric bulk wave filters 1 and 1A, and these harmonic waves could become spurious. Modes indicated by arrows A and B in FIG. 29 and modes indicated by arrows C and D in FIG. 30, other than those in use, become spurious.

Since the multi-mode piezoelectric bulk wave filters 1 and 1A are cascaded as a two-stage piezoelectric bulk wave filter device 41, a large attenuation results as shown in FIG. 31. Since the multi-mode piezoelectric bulk wave filters 1 and 1A use different orders of harmonic waves, the frequency of the mode becoming spurious in the multi-mode piezoelectric bulk wave filter 1 and frequency of the mode becoming spurious in the multi-mode piezoelectric bulk wave filter 1A are different. The spurious characteristics of the multi-mode piezoelectric bulk wave filters 1 and 1A as the two filter elements are different, thereby canceling each other. As shown in FIG. 31, the spurious frequencies are effectively reduced, and a larger stop band attenuation is obtained.

In the fifth preferred embodiment, the multi-mode piezoelectric bulk wave filter 1 using the 11th through 13th harmonic waves is combined with the multi-mode piezoelectric bulk wave filter 1A using the 13th through 15th harmonic waves. The orders of harmonic waves are selected to meet a desired filter bandwidth.

It is not a requirement that the thicknesses of the piezoelectric layers sandwiched between the exciting electrodes connected to different potentials are uniform. By making the thicknesses different, the exciting efficiency of the orders of the modes in use is increased, and the exciting efficiency of the orders of the modes becoming spurious is decreased.

In the piezoelectric bulk wave filter device 41, a cap member 50 having a bottom opening is attached to the casing substrate 42. The piezoelectric bulk wave filter device 41 is supplied as an electronic component having a package structure disposed of the casing substrate 42 and the cap member 50.

Figure 32:
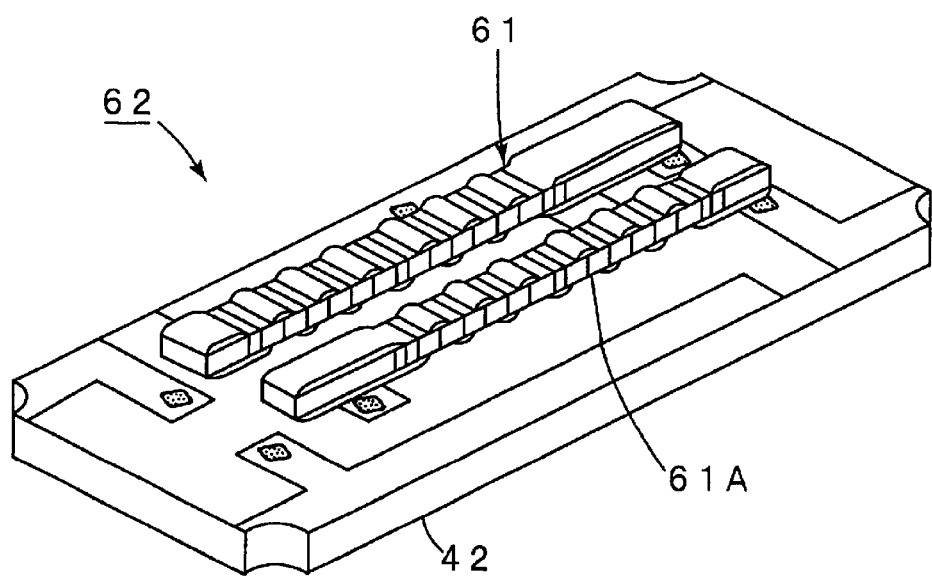
FIG. 32 is a perspective view showing the longitudinally coupled multi-mode piezoelectric bulk wave filter device in accordance with a sixth preferred embodiment of the present: invention.

FIG. 32 is a perspective view showing the longitudinally coupled multi-mode piezoelectric bulk wave filter device 62 in accordance with a sixth preferred embodiment of the present invention. The fifth preferred embodiment includes the multi-mode piezoelectric bulk wave filters 1 and 1A operating in different orders of harmonic modes. The sixth preferred embodiment includes longitudinally coupled multi-mode piezoelectric bulk wave filters 61 and 61A which have different widths and are cascaded and mounted on a casing substrate 42.

In accordance with the preferred embodiments of the present invention, the first longitudinally coupled multi-mode piezoelectric bulk wave filter 61 and the second longitudinally coupled multi-mode piezoelectric bulk wave filter 61A, which define a multi-mode piezoelectric bulk wave filter device, may be different in length or width.

As the multi-mode piezoelectric bulk wave filter device 62, each of the piezoelectric bulk wave filters 61 and 61A is strongly excited in the 12th harmonic wave in the length vibration in the symmetrical mode, while being strongly excited in the 11th and the 13th harmonic waves in the anti-symmetrical mode. The 11th through 13th harmonic waves are coupled, forming a filter characteristic.

Because the first longitudinally coupled multi-mode piezoelectric bulk wave filter 61 and the second longitudinally coupled multi-mode piezoelectric bulk wave filter 61A have different width dimensions, a large attenuation results. The filter characteristics are discussed with reference to FIGS. 33–35.

In the piezoelectric bulk wave filter 61, the thickness of the piezoelectric layer sandwiched between the exciting electrodes connected to different potentials is, for example, about 150 μm, and the thickness of the piezoelectric body is about 120 μm. The width of the first longitudinally coupled multi-mode piezoelectric bulk wave filter 61 is about 300 μm, and the width of the second longitudinally coupled multi-mode piezoelectric bulk wave filter 61A is about 200 μm. The remaining specifications of the piezoelectric bulk wave filters 61 and 61A are identical to the first longitudinally coupled multi-mode piezoelectric bulk wave filter 1.

Figure 33:
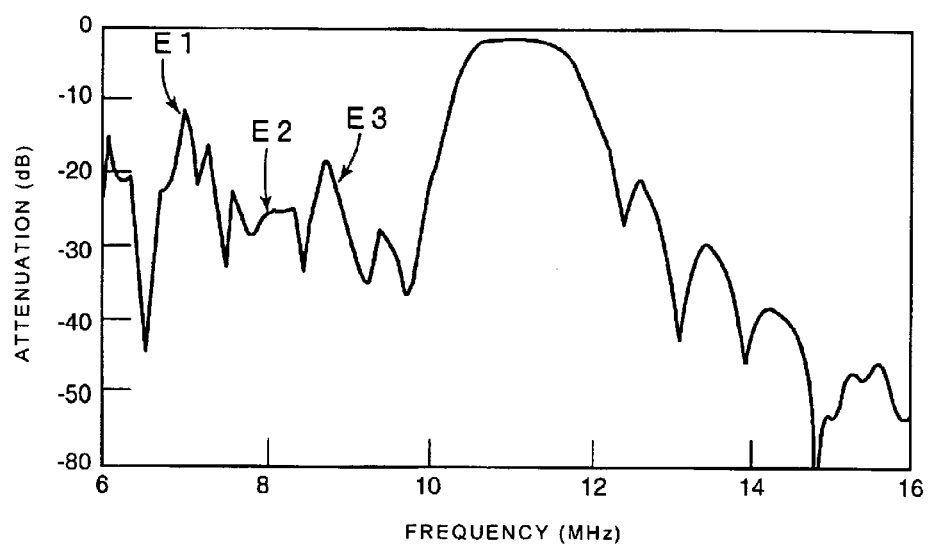
FIG. 33 shows filter characteristics of a first longitudinally coupled multi-mode piezoelectric bulk wave filter for use in the sixth preferred embodiment of the present invention.
Figure 34:
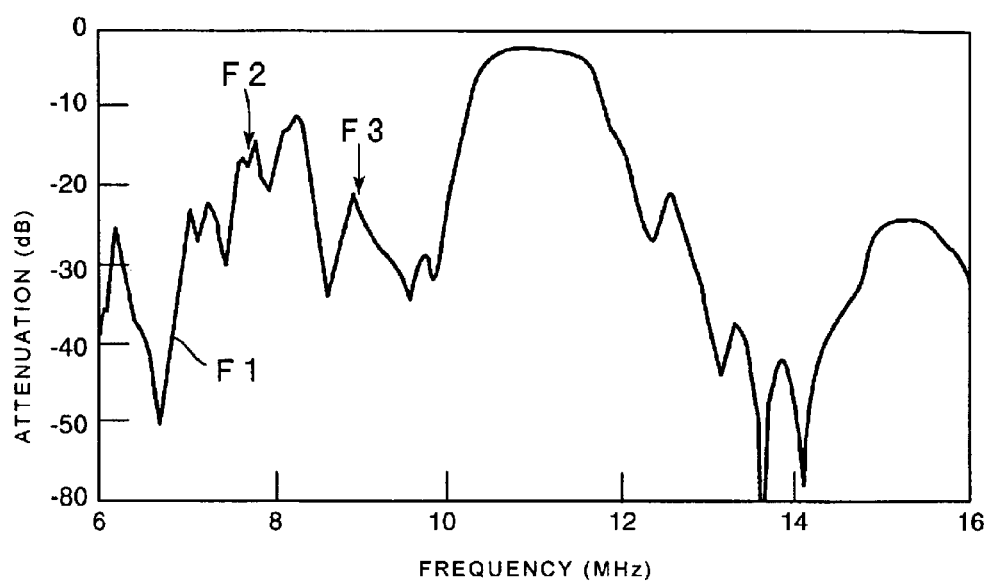
FIG. 34 shows filter characteristics of a second longitudinally coupled multi-mode piezoelectric bulk wave filter for use in the sixth preferred embodiment of the present invention.
Figure 35:
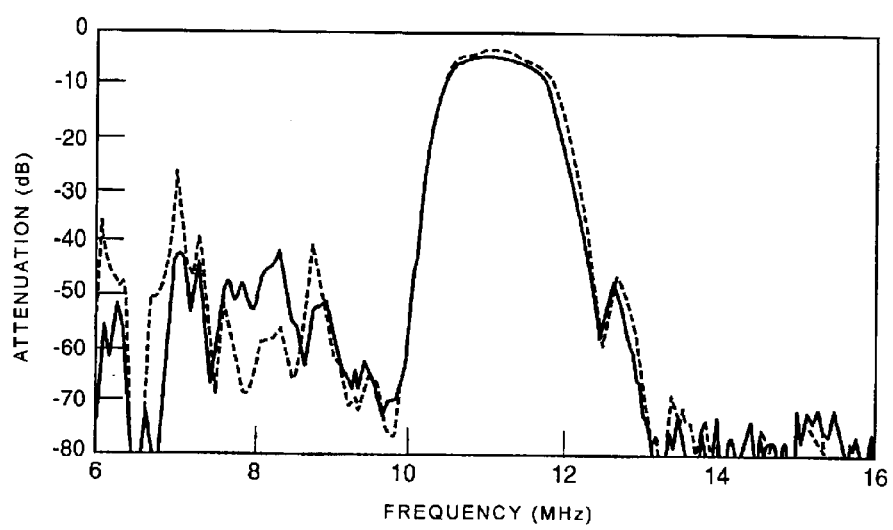
FIG. 35 shows filter characteristics of the longitudinally coupled multi-mode piezoelectric bulk wave filter device of the sixth preferred embodiment of the present invention.

FIG. 33 shows filter characteristics of the first longitudinally coupled multi-mode piezoelectric bulk wave filter 61, and FIG. 34 shows filter characteristics of the second longitudinally coupled multi-mode piezoelectric bulk wave filter 61A. FIG. 35 shows filter characteristics of the longitudinally coupled multi-mode piezoelectric bulk wave filter device 62 in which the longitudinally coupled multi-mode piezoelectric bulk wave filters 61 and 61A are cascaded.

Each of the longitudinally coupled multi-mode piezoelectric bulk wave filters 61 and 61A preferably has a bar-like structure having a substantially rectangular shape in cross section. Spurious vibrations due to width dimensions occur. Because of the cascaded multi-mode piezoelectric bulk wave filters 61 and 61A, the piezoelectric bulk wave filter device 62 provides a larger attenuation. Spurious frequency components E1–E3 shown in FIG. 33 and spurious frequency components F1–F3 shown in FIG. 34 cancel each other. As a result, the spurious components are effectively reduced as shown in FIG. 35.

In comparison with the case in which the number of filter. element stages is merely increased, a resulting stop band attenuation is substantially large.

Figure 36:
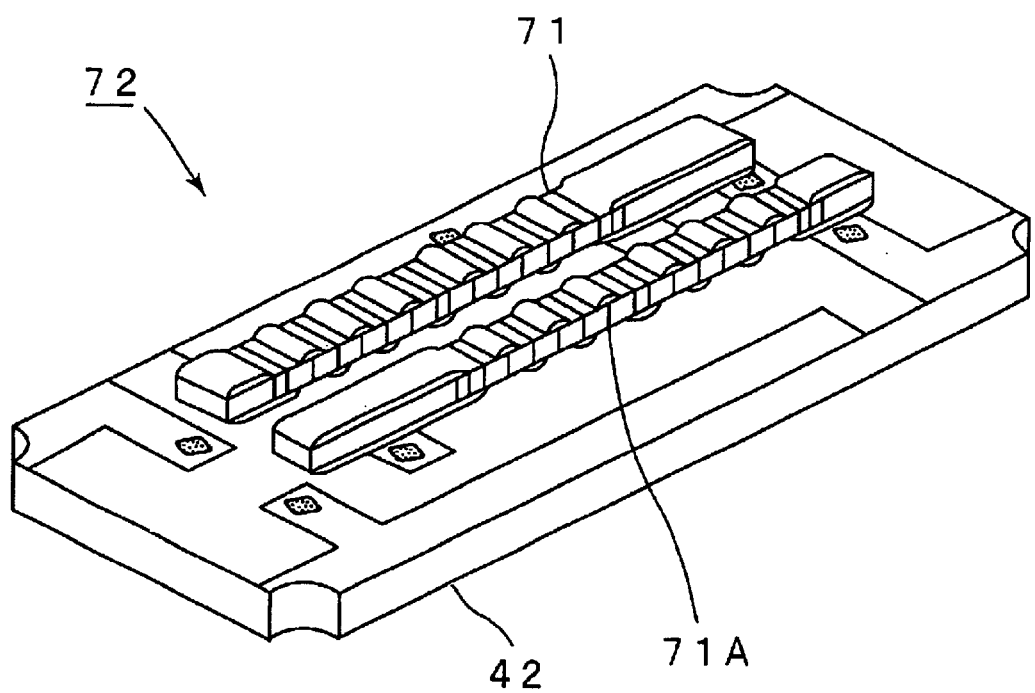
FIG. 36 is a perspective view of the longitudinally coupled multi-mode piezoelectric bulk wave filter device in accordance with a seventh preferred embodiment of the present invention.

FIG. 36 is a perspective view of the longitudinally coupled multi-mode piezoelectric bulk wave filter device 72 in accordance with a seventh preferred embodiment of the present invention. In the seventh preferred embodiment, first and second longitudinally coupled multi-mode piezoelectric bulk wave filters 71 and 71A are mounted on a casing substrate 42. The longitudinally coupled multi-mode piezoelectric bulk wave filters 71 and 71A are mounted on the casing substrate 42. As the longitudinally coupled multi-mode piezoelectric bulk wave filter 1, the longitudinally coupled multi-mode piezoelectric bulk wave filters 71 and 71A use harmonic waves of the length vibration mode. As the multi-mode piezoelectric bulk wave filter 1, the piezoelectric bulk wave filters 71 and 71A are efficiently excited in the 12th harmonic in the symmetrical mode, while being efficiently excited in the 11th and the 13th harmonic waves in the anti-symmetrical node. As in the multi-mode piezoelectric bulk wave filter 1, the 11th through 13th harmonic waves are coupled forming a filter characteristic in the piezoelectric bulk wave filters 71 and 71A.

The piezoelectric bulk wave filters 71 and 71A are different in length. The thickness of the piezoelectric layer sandwiched between the exciting electrodes connected to different potentials in the piezoelectric bulk wave filter 71A is preferably smaller than the thickness of the piezoelectric layer sandwiched between the exciting electrodes connected to different potentials in the piezoelectric bulk wave filter 71.

By making the length dimensions of the first and second longitudinally coupled multi-mode piezoelectric bulk wave filters 71 and 71A different, spurious components are reduced and a large stop band attenuation results.

Because each of the longitudinally coupled multi-mode piezoelectric bulk wave filters 71 and 71A preferably has a bar-like structure having a substantially rectangular shape in cross section, spurious vibrations due to length dimensions occur. By making the longitudinally coupled multi-mode piezoelectric bulk wave filters 71 and 71A different in length, the frequency of the length mode becoming a spurious component in the first piezoelectric bulk wave filter 71 becomes different from the frequency of the length mode becoming a spurious component in the second piezoelectric bulk wave filter 71A. With the piezoelectric bulk wave filters 71 and 71A cascaded, the spurious components of the piezoelectric bulk wave filters 71 and 71A are canceled and a large stop band attenuation results.

Figure 37:
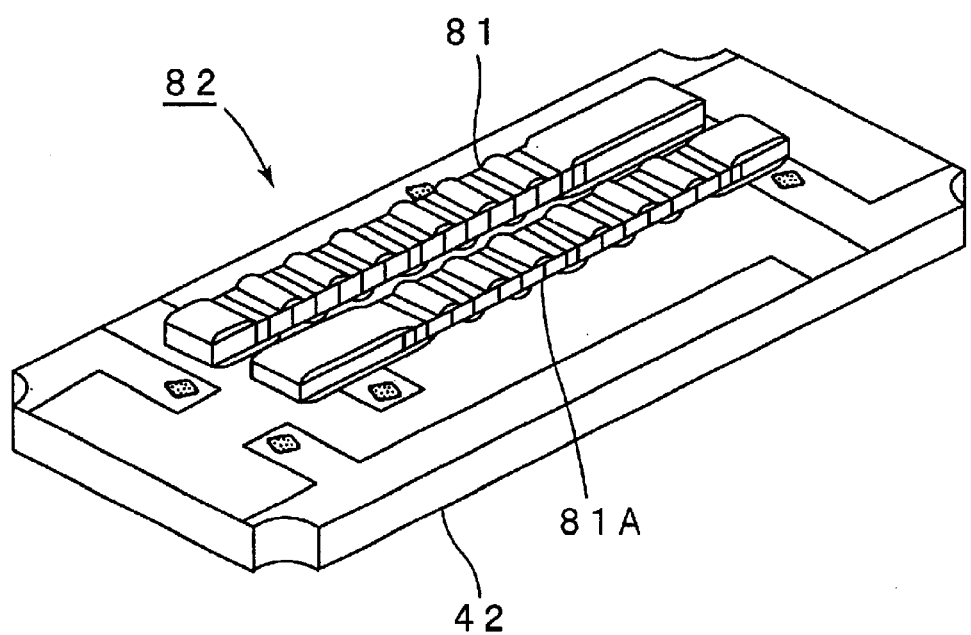
FIG. 37 is a perspective view of the longitudinally coupled multi-mode piezoelectric bulk wave filter device in accordance with an eighth preferred embodiment of the present invention.

FIG. 37 is a perspective view of the longitudinally coupled multi-mode piezoelectric bulk wave filter device 82 in accordance with an eighth preferred embodiment of the present invention. The piezoelectric bulk wave filter device 82 includes first and second longitudinally coupled multi-mode piezoelectric bulk wave filters 81 and 81A preferably mounted on a casing substrate 42. Each of the piezoelectric bulk wave filters 81 and 81A has the same structure as the multi-mode piezoelectric bulk wave filter 1. Each of the piezoelectric bulk wave filters 81 and 81A uses harmonic waves of the length vibration mode excited. As in the piezoelectric bulk wave filter 1, the piezoelectric bulk wave filters 81 and 81A couple the 11th through 13th harmonic waves.

The thickness of the piezoelectric bulk wave filter 81 is preferably larger than the thickness of the piezoelectric bulk wave filter 81A. The rest of the construction of the piezoelectric bulk wave filters 81 and 81A remains unchanged from that of the multi-mode piezoelectric bulk wave filter 1.

By cascading the first and second longitudinally coupled multi-mode piezoelectric-bulk wave filters 81 and 81A, not only is a large attenuation provided, but also spurious components due to shear in thickness dimensions are reduced. Although spurious components occur in the shear mode, the difference in thickness dimensions makes the spurious frequencies in the shear mode in the first piezoelectric bulk wave filter 81 different from the spurious frequencies in the shear mode in the second piezoelectric bulk wave filter 81A. If the piezoelectric bulk wave filters 81 and 81A are cascaded, the spurious components in the piezoelectric bulk wave filters 81 and 81A cancel each other and a large stop band attenuation results.

Figure 38:
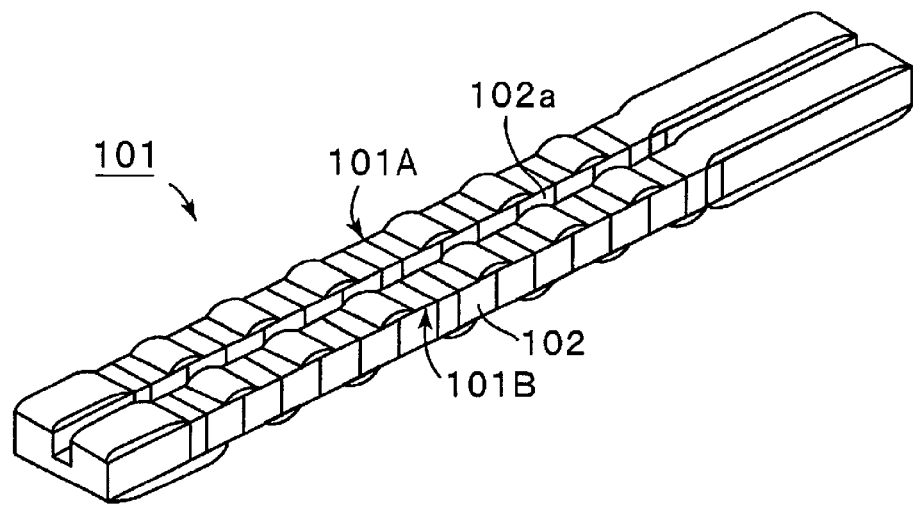
FIG. 38 is a perspective view showing a modification of the longitudinally coupled multi-mode piezoelectric bulk wave filter used as the first longitudinally coupled multi-mode piezoelectric bulk wave filter or the second longitudinally coupled multi-mode piezoelectric bulk wave filter.

FIG. 38 is a perspective view showing a modification of the longitudinally coupled multi-mode piezoelectric bulk wave filter used as the first longitudinally coupled multi-mode piezoelectric bulk wave filter or the second longitudinally coupled multi-mode piezoelectric bulk wave filter. A longitudinally coupled multi-mode piezoelectric bulk wave filter 101 includes longitudinally coupled multi-mode piezoelectric bulk wave filter blocks 101A and 101B. The longitudinally coupled multi-mode piezoelectric bulk wave filter blocks 101A and 101B are integrally disposed using the same piezoelectric body 102. Specifically, the laminated piezoelectric body 102 is segmented into the longitudinally coupled multi-mode piezoelectric bulk wave filter blocks 101A and 101B by forming a groove 102a on the top surface of the laminated piezoelectric body. The longitudinally coupled multi-mode piezoelectric bulk wave filter blocks 101A and 101B remain integrally connected on their longitudinal sides.

The laminated piezoelectric body 102, the reflective layers, and the support layers are integrated. The groove 102a is disposed on the laminated piezoelectric body 102 after the reflective layers and the support layers are disposed on both ends of the laminated piezoelectric body 102. Like the piezoelectric bulk wave filters 1 and 1A, a single filter element longitudinally coupled multi-mode piezoelectric bulk wave filter is formed. Because the resonator of the longitudinally coupled multi-mode piezoelectric bulk wave filter has a substantially rectangular shape in cross section, width mode spurious components are generated due to the width dimensions. The attenuation characteristics of the stop band are degraded by the spurious components. By forming the groove 102a, the spurious component due to the resonator width is dispersed, and the attenuation is increased.

Figure 39:
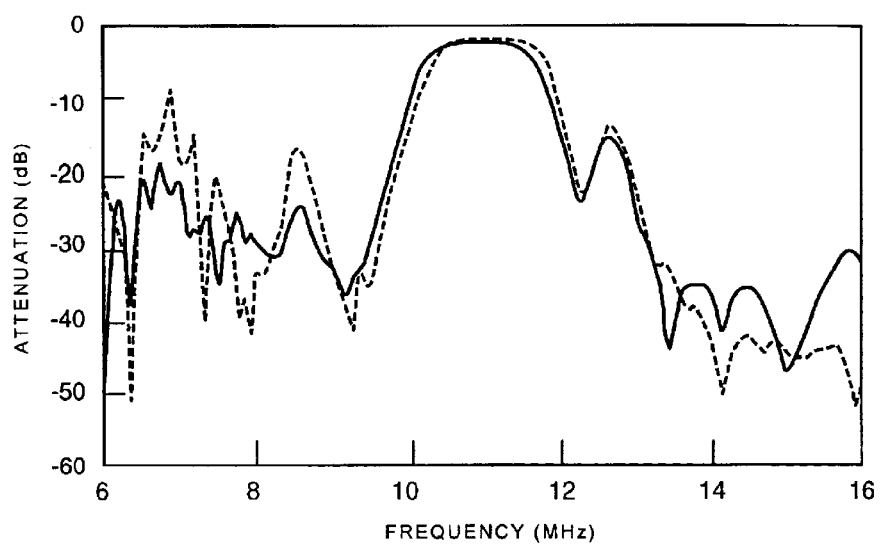
FIG. 39 shows filter characteristics of a one-element longitudinally coupled multi-mode piezoelectric bulk wave filter.

FIG. 39 shows a-difference in attenuation of the one-element filter attributed to a difference between the presence and absence of the groove. The one-element filter without the groove is shown in a broken line, and the one-element filter having the groove 102a is shown in a solid line. The filter having the laminated piezoelectric body 102 provides higher attenuation in the region outside the passband thereof.

Figure 40:
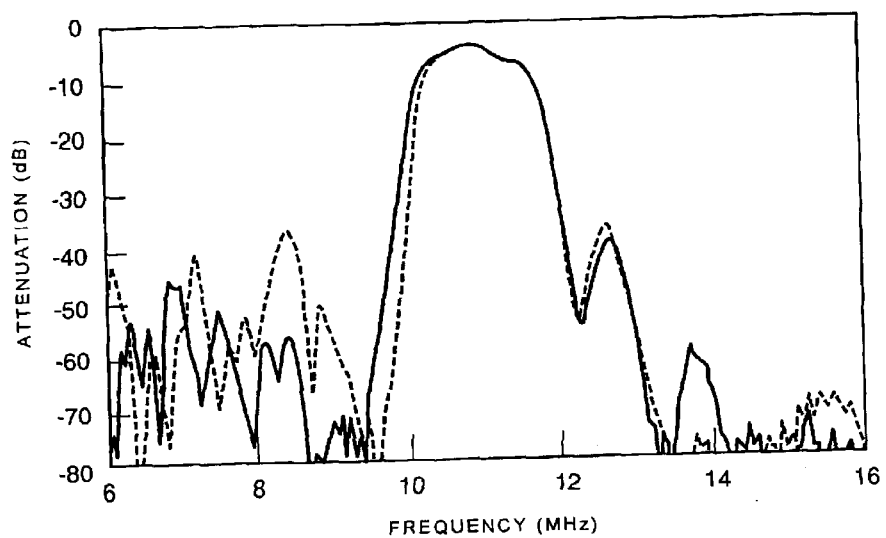
FIG. 40 shows filter characteristics of the two-element longitudinally coupled multi-mode piezoelectric bulk wave filter of FIG. 38.

FIG. 40 shows filter characteristics of a two-element longitudinally coupled multi-mode piezoelectric bulk wave filter composed of serially connected two elements. The broken line represents the filter characteristics of the serially connected two elements where each filter element has no groove, and the solid line represents the filter characteristics of the serially connected two elements where each filter element has the groove 102a. As seen in FIG. 40, the longitudinally coupled multi-mode piezoelectric bulk wave filter including the two elements having the groove 102a provides a higher attenuation outside the pass band. The use of the longitudinally coupled multi-mode piezoelectric bulk wave filter block 101A having the groove 102a offers a larger attenuation.

In the preferred embodiments of the present invention, one or both of the first and second longitudinally coupled multi-mode piezoelectric bulk wave filters may be disposed of the longitudinally coupled multi-mode piezoelectric bulk wave filter 101. In this arrangement, even higher attenuation outside the pass band results.

Figure 41:
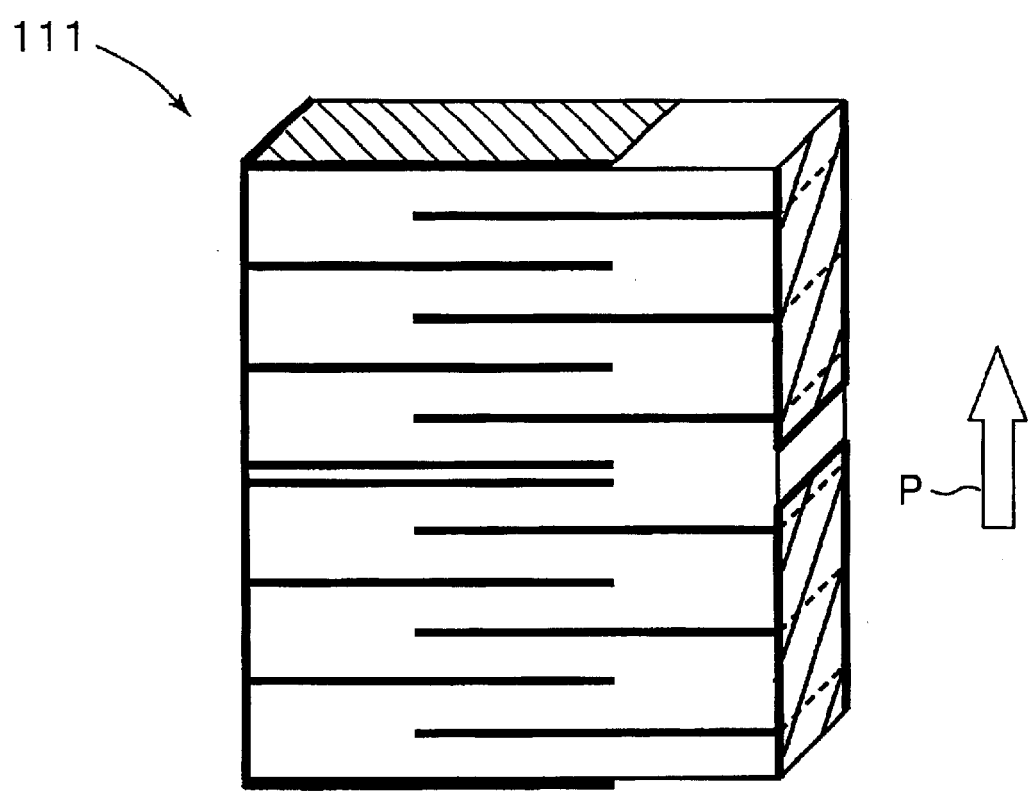
FIG. 41 is a perspective view showing another longitudinally coupled multi-mode piezoelectric bulk wave filter used in various preferred embodiments of the present invention.
Figure 42:
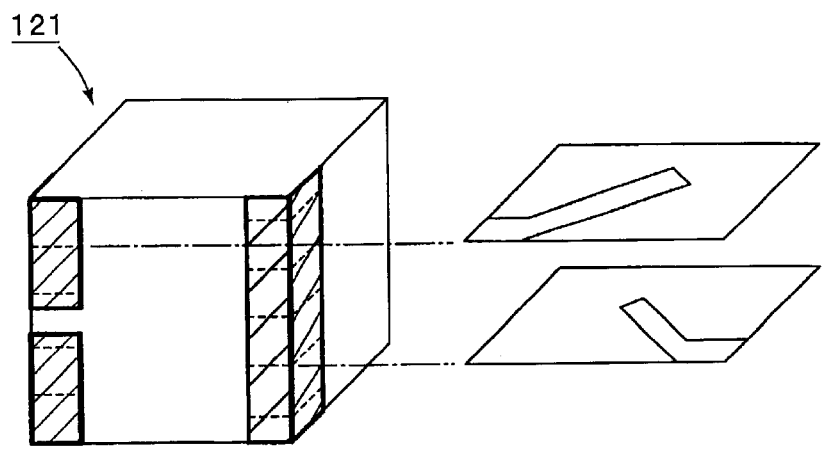
FIG. 42 is a perspective view showing yet another longitudinally coupled multi-mode piezoelectric bulk wave filter used in various preferred embodiments of the present invention.

The above-described preferred embodiments have been described with reference to the longitudinally coupled multi-mode piezoelectric bulk wave filters using harmonic waves of the length vibration mode. The present invention is not limited to any particular vibration mode. For example, the present invention may be applied to a longitudinally coupled multi-mode piezoelectric bulk wave filter 111 using a harmonic wave of a thickness vibration mode shown in FIG. 41, and an energy trapped longitudinally coupled multi-mode piezoelectric bulk wave filter 121 using a harmonic wave of a thickness vibration. As shown in FIG. 41, an arrow P represents the direction of polarization.

At least a third longitudinally coupled multi-mode piezoelectric bulk wave filter may be connected to the first and second longitudinally coupled multi-mode piezoelectric bulk wave filters.

The first and second longitudinally coupled multi-mode piezoelectric bulk wave filters provide filter characteristics by coupling excited vibrations of different orders of harmonic modes of vibration. The filters thus result in wide band and large attenuation filter characteristics. Because the first and second longitudinally coupled multi-mode piezoelectric bulk wave filters are arranged with the distance between the ground electrodes thereof smaller than the distance between the input electrodes of the first and second filters and the distance between the output electrodes of the first and second filters, the attenuation is increased.

In this arrangement, a wide band and large attenuation multi-mode piezoelectric bulk wave filter results.

Because the first and the second reflective layers and the first and the second support members are disposed on the first and second end surfaces of the laminated piezoelectric body, a vibration transferred from the piezoelectric body is reflected from the boundary between the reflective layer and the support member. Even if the first and second filters are mechanically supported at the support members, their filter characteristics are not degraded. Because the capacitor unit defining the relay capacitor is provided, the stop band attenuation becomes even larger.

Because the relay capacitor is formed in the piezoelectric substrate in the conventional piezoelectric bulk wave filter, the relay capacitor portion is vibrated based on the piezoelectric effect and unwanted spurious components are generated. Because there is no need for fabricating the support member of a piezoelectric material, unwanted spurious components are effectively controlled.

Because the first and second longitudinally coupled multi-mode piezoelectric bulk wave filters are cascaded, the number of element stages is increased, resulting in even higher attenuation.

The first and second piezoelectric bulk wave filters which preferably use different orders of harmonic waves and can be different in width and/or length. The spurious frequencies of the first and second longitudinally coupled multi-mode piezoelectric bulk wave filters cancel each other out, and a large attenuation results.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A longitudinally coupled multi-mode piezoelectric bulk wave filter device comprising:

first and second multi-mode piezoelectric bulk wave filters which are designed so that vibration modes of different orders of harmonic waves are excited and coupled to provide an output signal between an output electrode and an ground electrode when an input signal is input between an input electrode and the ground electrode; and a casing substrate on which the first and second longitudinally coupled multi-mode piezoelectric bulk wave filters are disposed on a surface thereof, wherein each of the first and second multi-mode piezoelectric bulk wave filters includes:

at least four exciting electrodes extending substantially parallel to each other; and a laminated piezoelectric body having a plurality of piezoelectric layers arranged between the exciting electrodes and polarized in a direction that is substantially perpendicular to or substantially parallel to the exciting electrodes and having first and second end surfaces facing in a direction that is substantially perpendicular to the plurality of the piezoelectric layers and first through fourth side surfaces connecting the first and second end surfaces; wherein the input electrode is disposed on at least one of the first through fourth side surfaces of the laminated piezoelectric body closer to the first end surface;

the output electrode is disposed on at least one of the first through fourth side surfaces of the laminated piezoelectric body closer to the second end surface;

the ground electrode is disposed on at least one of the first through fourth side surfaces of the laminated piezoelectric body;

the at least four exciting electrodes includes a first group which is connected to the input electrode, a second group which is connected to the output electrode, and a third group which is connected to the ground electrode;

the first and second multi-mode piezoelectric bulk wave filters are cascaded and arranged so that distance between the ground electrodes of the first and second multi-mode piezoelectric bulk wave filters is smaller than the distance between the input electrodes of the first and second multi-mode piezoelectric bulk wave filters and the distance between the output electrodes of the first and second multi-mode piezoelectric bulk wave filters.

2. A longitudinally coupled multi-mode piezoelectric bulk wave filter device according to claim 1, wherein the vibration modes of different order are harmonic waves of a length vibration mode.

3. A longitudinally coupled multi-mode piezoelectric bulk wave filter device according to claim 1, wherein the vibration modes of different orders are harmonic waves of a thickness vibration mode.

4. A longitudinally coupled multi-mode piezoelectric bulk wave filter device according to claim 1, further comprising:

reflective layers connected to the first and second end surfaces of the laminated piezoelectric body and fabricated of a material having an acoustic impedance $Z_2$ lower than an acoustic impedance $Z_1$ of a piezoelectric material of the laminated piezoelectric body; and support members connected to the surfaces of the reflective layers opposite from the surfaces thereof connected to the first and second end surfaces of the laminated piezoelectric body and fabricated of a material having a acoustic impedance $Z_3$ higher than the acoustic impedance $Z_2$ of the reflective layers.

5. A longitudinally coupled multi-mode piezoelectric bulk wave filter comprising:

at least four exciting electrodes extending substantially parallel to each other;

a laminated piezoelectric body having a plurality of piezoelectric layers arranged between the exciting electrodes and polarized in a direction that is substantially perpendicular to or substantially parallel to the exciting electrodes and having first and second end surfaces facing in a direction that is substantially perpendicular to the plurality of the piezoelectric layers and first through fourth side surfaces connecting the first and second end surfaces;

an input electrode disposed on the first side surface of the laminated piezoelectric body closer to the first end surface;

an output electrode disposed on the first side surface of the laminated piezoelectric body closer to the second end surface;

a ground electrode disposed on the second side surface of the laminated piezoelectric body opposite from the first side surface; first and second reflective layers arranged, respectively, on the first and second end surfaces of the laminated piezoelectric body and having an acoustic impedance $Z_2$ lower than an acoustic impedance $Z_1$ of the laminated piezoelectric body;

first and second support members arranged, respectively, on the first and second reflective layers and having a acoustic impedance $Z_3$ higher than the acoustic impedance $Z_2$ of the reflective layers; and a capacitor unit disposed on at least one of the first support member and the second support member so that the capacitor unit is connected between the ground electrode and one of the output electrode and the input electrode; wherein the at least four exciting electrodes includes a first group which is connected to the input electrode, a second group which is connected to the output electrode, and a third group which is connected to the ground electrode; and when an input signal is input between the input electrode and the ground electrode, vibration modes of different orders of harmonic waves are excited and coupled so that an output signal is output between the output terminal and the ground terminal.

6. A longitudinally coupled multi-mode piezoelectric bulk wave filter according to claim 5, wherein the capacitor unit includes a pair of capacitor electrodes disposed on a pair of externally opposed surfaces of at leat one of the first and second support members.

7. A longitudinally coupled multi-mode piezoelectric bulk wave filter according to claim 5, wherein the capacitor unit includes a plurality of internal electrodes being laminated with each other with support member layers of at least one of the first and second support members interposed therebetween.

8. A longitudinally coupled multi-mode piezoelectric bulk wave filter according to claim 5, wherein the vibration modes of different orders are harmonic waves of a length vibration mode.

9. A longitudinally coupled multi-mode piezoelectric bulk wave filter according to claim 5, wherein the vibration modes of different orders are harmonic waves of a thickness vibration mode.

10. An electronic component comprising:
a casing substrate;
a longitudinally coupled multi-mode piezoelectric bulk wave filter according to claim 5 mounted on the casing substrate; and
cap member secured to the casing substrate such that the cap surrounds the longitudinally coupled multi-mode piezoelectric bulk wave filter.

11. A longitudinally coupled multi-mode piezoelectric bulk wave filter device comprising:
first and second multi-mode piezoelectric bulk wave filters which are designed so that vibration modes of different orders of harmonic waves are excited and coupled to provide an output signal between an output electrode and a ground electrode when an input signal is input between an input electrode and the ground electrode;
wherein each of the first and second multi-mode piezoelectric bulk wave filters includes:
at least four exciting electrodes extending substantially parallel to each other; and
a laminated piezoelectric body having a plurality of piezoelectric layers arranged between the exciting electrodes and polarized in a direction that is substantially perpendicular to or substantially parallel to the exciting electrodes and having first and second end surfaces facing in a direction that is substantially perpendicular to the plurality of the piezoelectric layers and first through fourth side surfaces connecting the first and second end surfaces; wherein
the input electrode is disposed on at least one of the first through fourth side surfaces of the laminated piezoelectric body closer to the first end surface;
the output electrode is disposed on at least one of the first through fourth side surfaces of the laminated piezoelectric body closer to the second end surface;
the ground electrode is disposed on at least one of the first through fourth side surfaces of the laminated piezoelectric body;
the at least four exciting electrodes includes a first group which is connected to the input electrode, a second group which is connected to the output electrode, and a third group which is connected to the ground electrode;
the first and second multi-mode piezoelectric bulk wave filters are cascaded; and
the first longitudinally coupled multi-mode piezoelectric bulk wave filter and the second longitudinally coupled multi-mode piezoelectric bulk wave filter are different in dimensions.

12. A longitudinally coupled multi-mode piezoelectric bulk wave filter device according to claim 11, wherein the first longitudinally coupled multi-mode piezoelectric bulk wave filter and the second longitudinally coupled multi-mode piezoelectric bulk wave filter have different widths.

13. A longitudinally coupled multi-mode piezoelectric bulk wave filter device according to claim 11, wherein the first longitudinally coupled multi-mode piezoelectric bulk wave filter and the second longitudinally coupled multi-mode piezoelectric bulk wave filter have different dimensions.

14. A longitudinally coupled multi-mode piezoelectric bulk wave filter device comprising:
first and second multi-mode piezoelectric bulk wave filters which are designed so that vibration modes of different orders of harmonic waves are excited and coupled to provide an output signal between an output electrode and a ground electrode when an input signal is input between an input electrode and the ground electrode;
wherein each of the first and second multi-mode piezoelectric bulk wave filters includes:
at least four exciting electrodes extending substantially parallel to each other; and
a laminated piezoelectric body having a plurality of piezoelectric layers arranged between the exciting electrodes and polarized in a direction that is substantially perpendicular to or substantially parallel to the exciting electrodes and having first and second end surfaces facing in a direction that is substantially perpendicular to the plurality of the piezoelectric layers and first through fourth side surfaces connecting the first and second end surfaces; wherein
the input electrode is disposed on at least one of the first through fourth side surfaces of the laminated piezoelectric body closer to the first end surface;
the output electrode is disposed on at least one of the first through fourth side surfaces of the laminated piezoelectric body closer to the second end surface;
the ground electrode is disposed on at least one of the first through fourth side surfaces of the laminated piezoelectric body;
the at least four exciting electrodes includes a first group which is connected to the input electrode, a second group which is connected to the output electrode, and a third group which is connected to the ground electrode;
the first and second multi-mode piezoelectric bulk wave filters are cascaded; and
at least one of the orders of harmonic waves used by the first longitudinally coupled multi-mode piezoelectric bulk wave filter is different from at least one of the orders of harmonic waves used by the second longitudinally coupled multi-mode piezoelectric bulk wave filter.

15. A longitudinally coupled multi-mode piezoelectric bulk wave filter device according to claim 14, further comprising at least another longitudinally coupled multi-mode piezoelectric bulk wave filter cascaded with the first longitudinally coupled multi-mode piezoelectric bulk wave filter and the second longitudinally coupled multi-mode piezoelectric bulk wave filter.

16. A longitudinally coupled multi-mode piezoelectric bulk wave filter device according to claim 14, wherein the vibration modes of different orders are harmonic waves of a length vibration mode.

17. A longitudinally coupled multi-mode piezoelectric bulk wave filter device according to claim 14, wherein the vibration modes of different orders are harmonic waves of a thickness vibration mode.

18. A longitudinally coupled multi-mode piezoelectric bulk wave filter device according to claim 14, further comprising:

reflective layers connected to the first and second end surfaces of the laminated piezoelectric body and fabricated of a material having a acoustic impedance $Z_2$ lower than an acoustic impedance $Z_1$ of a piezoelectric material of the laminated piezoelectric body; and support members connected to the surfaces of the reflective layers opposite from the surfaces thereof connected to the first and second end surfaces of the laminated piezoelectric body and fabricated of a material having a acoustic impedance $Z_3$ higher than the second acoustic impedance $Z_2$ of the reflective layers.

19. A longitudinally coupled multi-mode piezoelectric bulk wave filter device according to claim 14, wherein a groove is formed on at least one side surface of the laminated piezoelectric body of at least one of the first and second multi-mode piezoelectric bulk wave filters so as to define a pair of multi-mode piezoelectric bulk wave filter blocks which are integral on both sides of the groove.

20. An electronic component comprising:

a longitudinally coupled multi-mode piezoelectric bulk wave filter device according to claim 14;

a casing substrate bearing the longitudinally coupled multi-mode piezoelectric bulk wave filter device; and a cap member secured to the casing substrate such that the cap surrounds the longitudinally coupled multi-mode piezoelectric bulk wave filter device.

* * * * *